(12) United States Patent
Chen

(10) Patent No.: US 8,074,040 B2
(45) Date of Patent: Dec. 6, 2011

(54) FLASH DEVICE AND METHOD FOR IMPROVING PERFORMANCE OF FLASH DEVICE

(75) Inventor: Hong-Ching Chen, Kao-Hsiung Hsien (TW)

(73) Assignee: Mediatek Inc., Hsin-Chu (TW)

( * ) Notice: Subject to any disclaimer, the term of this patent is extended or adjusted under 35 U.S.C. 154(b) by 428 days.

(21) Appl. No.: 12/481,764

(22) Filed: Jun. 10, 2009

(65) Prior Publication Data

US 2010/0077134 A1 Mar. 25, 2010

Related U.S. Application Data

(60) Provisional application No. 61/099,240, filed on Sep. 23, 2008.

(51) Int. Cl.
*G06F 12/00* (2006.01)
(52) U.S. Cl. ............... 711/167; 711/103; 710/8; 710/58; 365/194
(58) Field of Classification Search .................. 711/167, 711/103; 710/8, 58; 365/194
See application file for complete search history.

(56) References Cited

U.S. PATENT DOCUMENTS

| 6,131,139 | A | * | 10/2000 | Kikuchi et al. ............... 711/103 |
| 7,480,187 | B2 | * | 1/2009 | Hwang .................... 365/185.33 |
| 7,827,431 | B2 | * | 11/2010 | Fujimoto ...................... 713/501 |
| 2006/0026340 | A1 | * | 2/2006 | Ito et al. ......................... 711/103 |
| 2007/0115724 | A1 | * | 5/2007 | Hwang .................... 365/185.17 |
| 2008/0098142 | A1 | * | 4/2008 | Fujimoto ...................... 710/106 |
| 2009/0024789 | A1 | * | 1/2009 | Rajan et al. .................. 711/105 |

* cited by examiner

*Primary Examiner* — Stephen Elmore
(74) *Attorney, Agent, or Firm* — Thomas|Kayden

(57) ABSTRACT

The invention provides a flash device. In one embodiment, the flash device comprises a first NAND flash integrated circuit, a second NAND flash integrated circuit, and a control integrated circuit. The control integrated circuit generates a plurality of first access signals with first timings to access the first NAND flash IC, and generates a plurality of second access signals with second timings to access the second NAND flash IC, wherein the first timings are different from the second timings. The first NAND flash integrated circuit then accesses data stored therein according to the first access signals. The second NAND flash integrated circuit then accesses data stored therein according to the second access signals.

23 Claims, 29 Drawing Sheets

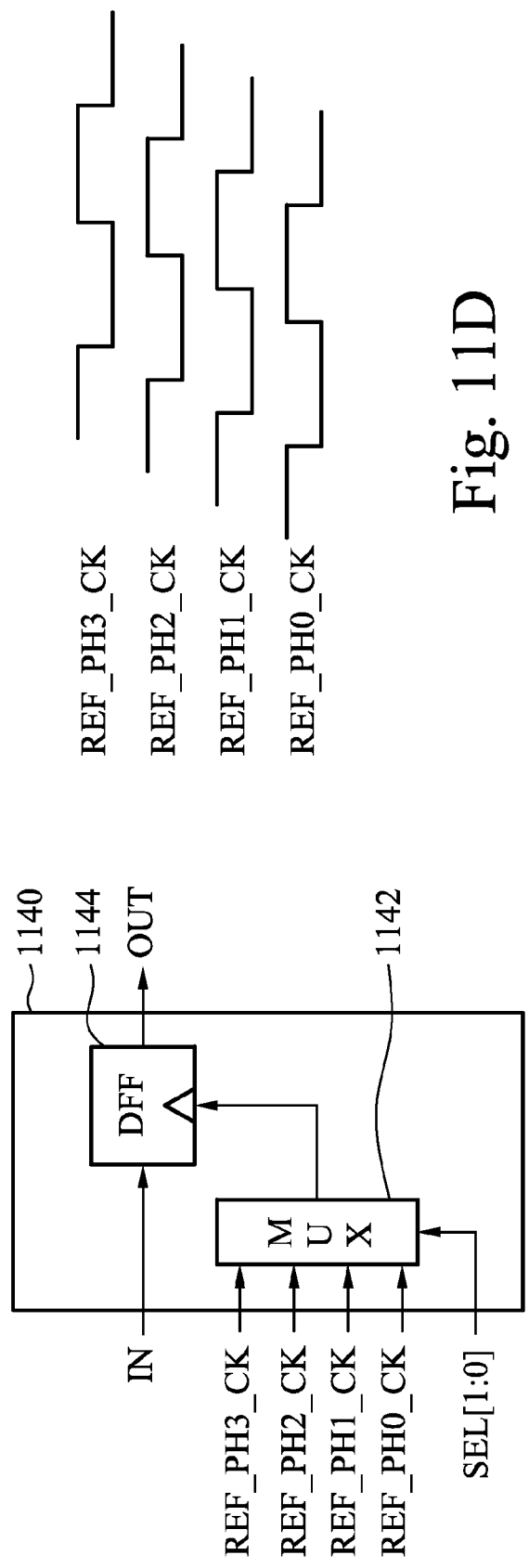

FLASH DEVICE AND METHOD FOR IMPROVING PERFORMANCE OF FLASH DEVICE

CROSS REFERENCE TO RELATED APPLICATIONS

This application claims the benefit of U.S. Provisional Application No. 61/099,240, filed on Sep. 23, 2008, the entirety of which is incorporated by reference herein.

BACKGROUND OF THE INVENTION

1. Field of the Invention

The invention relates to flash memories, and more particularly to control integrated circuits of flash memories.

2. Description of the Related Art

A flash memory is a non-volatile memory that can be electrically erased and reprogrammed. Flash memories are primarily used in memory cards and USB flash drives for general storage and transfer of data between computers and other digital products. Flash memory costs far less than EEPROM and therefore has become a dominant memory device. Examples of applications include Personal Digital Assistants (PDA) and laptop computers, digital audio players, digital cameras and mobile phones.

A flash device comprises a control integrated circuit (hereinafter, control IC) and at least one flash integrated circuit (hereinafter, flash IC). The flash IC stores data, and the control IC sends access signals to the flash IC to direct the flash IC to access data. Referring to FIG. 1A, a block diagram of a NAND flash integrated circuit (hereinafter, NAND flash IC) 100 is shown. The NAND flash IC 100 comprises an input/output control circuit 102, an input/output circuit 104, a control core circuit 106, a page buffer 108, and a flash core circuit 110. The I/O control circuit 102 receives a plurality of access signals from a control IC (not shown). In one embodiment, the access signals comprise a chip enable signal CE#, a command latch enable signal CLE, an address latch enable signal ALE, a write enable signal WE#, and a read enable signal RE#. The I/O circuit 104 then latches commands CMD and addresses sent by the control IC according to instructions of the I/O control circuit 102, and directs the flash core circuit 110 to access data stored therein according to the latched addresses. Data output by the flash core circuit 110 is stored in the page buffer 108 and then delivered to the I/O circuit 104, and the I/O circuit 104 sends the data to the control IC via an I/O bus (such as the bus I/O[7:0]). FIGS. 1B and 1C respectively show timings of the access signals CE#, CLE, ALE, WE#, and an I/O bus for directing the NAND flash IC 100 to receive commands and addresses from a control IC. FIG. 1D shows timings of the access signals CE#, CLE, ALE, WE#, and the I/O bus for directing the NAND flash IC 100 to receive data written thereto, and FIG. 1E shows timings of the access signals CE#, CLE, ALE, RE#, and the I/O bus for directing the flash IC 100 to read data written therefrom.

A control IC of a flash device may control data access of more than one NAND flash IC. The different NAND flash ICs may have different routing lengths and different routing loads, and therefore require different access timings. Thus, performance of the different NAND flash ICs is therefore degraded. A flash device mitigating the aforementioned disadvantages is therefore required.

BRIEF SUMMARY OF THE INVENTION

The invention provides a flash device. In one embodiment, the flash device comprises a first NAND flash integrated circuit, a second NAND flash integrated circuit, and a control integrated circuit. The control integrated circuit generates a plurality of first access signals with first timings to access the first NAND flash IC, and generates a plurality of second access signals with second timings to access the second NAND flash IC, wherein the first timings is different from the second timings. The first NAND flash integrated circuit then accesses data stored therein according to the first access signals. The second NAND flash integrated circuit then accesses data stored therein according to the second access signals.

The invention also provides a method for improving performance of a flash device. In one embodiment, the flash device comprises a control integrated circuit, a first NAND flash integrated circuit, and a second NAND flash integrated circuit. The control IC is directed to generate a plurality of first access signals with first timings to access the first NAND flash IC. The first NAND flash IC is then directed to access data stored therein according to the first access signals. The control IC is also directed to generate a plurality of second access signals with second timings to access the second NAND flash IC, wherein the first timings is different from the second timings. The second NAND flash IC is then directed to access data stored therein according to the second access signals.

The invention also provides a flash device. In one embodiment, the flash device comprises a control integrated circuit, a first NAND flash integrated circuit, and a second NAND flash integrated circuit. The control integrated circuit generates a plurality of first access signals to access the first NAND flash IC, and generates a plurality of second access signals to access the second NAND flash IC. The first NAND flash integrated circuit automatically adjusts first timings of the first access signals to obtain a plurality of first adjusted access signals, and accesses data stored therein according to the first adjusted access signals. The second NAND flash integrated circuit automatically adjusts second timings of the second access signals to obtain a plurality of second adjusted access signals, and accesses data stored therein according to the second adjusted access signals.

The invention also provides a flash device. In one embodiment, the flash device comprises a first NAND flash integrated circuit, a second NAND flash integrated circuit, and a control integrated circuit. The control integrated circuit generates a plurality of first access signals with first current levels to access the first NAND flash IC, and generates a plurality of second access signals with second current levels to access the second NAND flash IC, wherein the first current levels are different from the second current levels. The first NAND flash integrated circuit then accesses data stored therein according to the first access signals. The second NAND flash integrated circuit then accesses data stored therein according to the second access signals.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 11A~11D are block diagrams of embodiments of an adjustable delay unit according to the invention;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
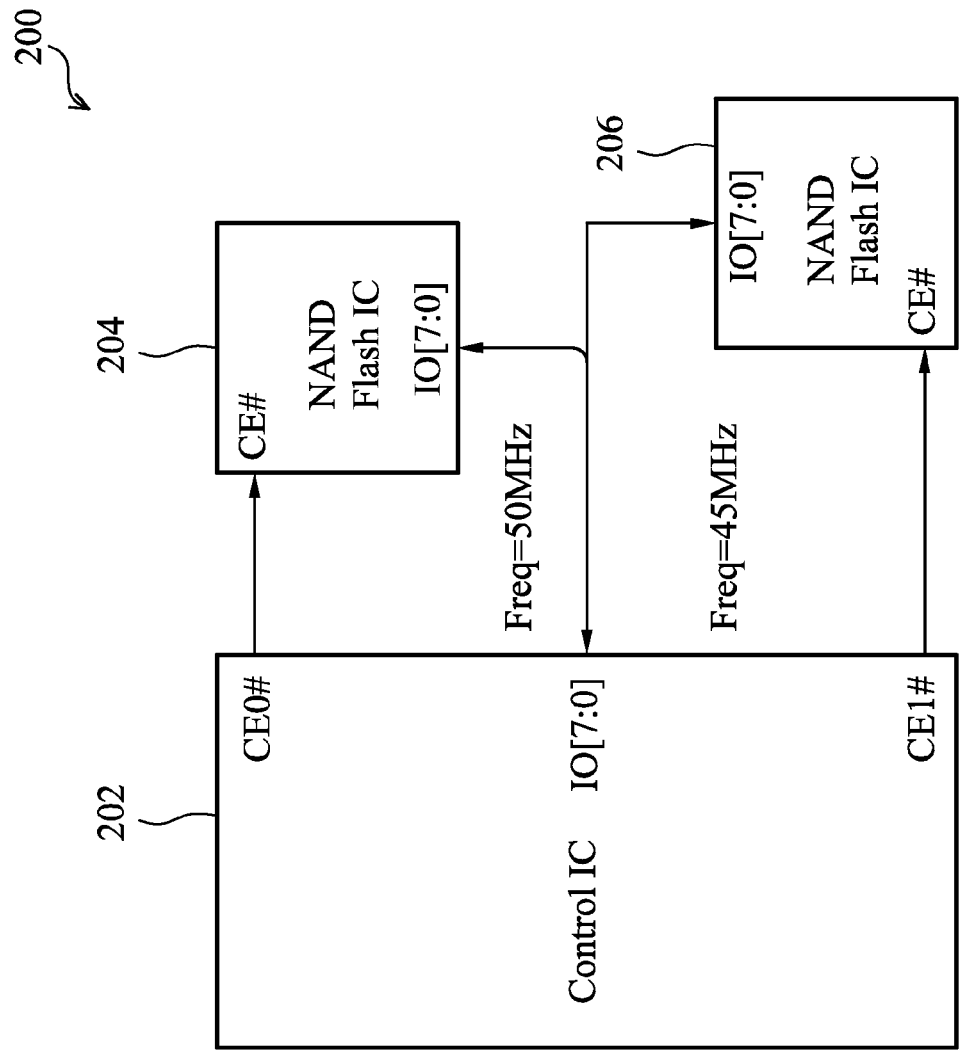
FIG. 2 is a block diagram of an embodiment of a flash device according to the invention.

Referring to FIG. 2, a block diagram of an embodiment of a flash device 200 according to the invention is shown. The flash device 200 comprises a control integrated circuit 202 and two NAND flash integrated circuits 204 and 206. The control IC 202 controls the two NAND flash ICs 204 and 206. Input/output pins of the NAND flash ICs 204 and 206 are both coupled to input/output pins of the control IC 202 via the same I/O bus. When the control IC 202 accesses one of the NAND flash ICs 202 and 204, the control IC 202 adjusts the access cycle period of the IO bus to accommodate the corresponding NAND flash ICs 202 and 204. The NAND flash ICs 202 and 204 are therefore accessed according to different access frequencies. In one embodiment, the NAND flash IC 204 can be accessed according to a higher access frequency such as 50 MHz, and the NAND flash IC 206 can be accessed according to a lower access frequency such as 45 MHz. The control IC 202 therefore sends signals with a shorter cycle period to the NAND flash IC 204 via the I/O bus to access the NAND flash IC 204, and sends signals with a longer cycle period to the NAND flash IC 206 via the I/O bus to access the NAND flash IC 206.

Figure 3A:
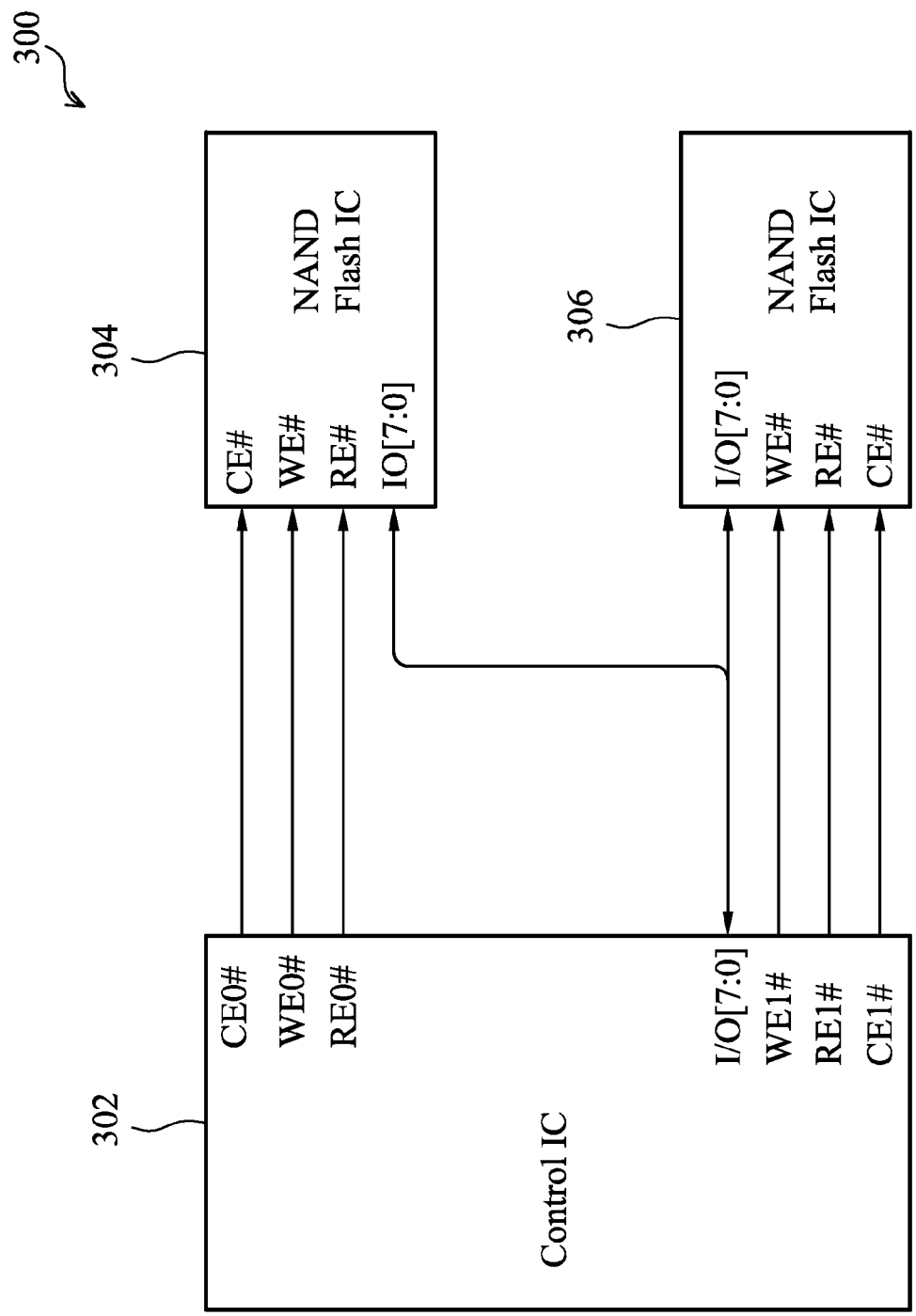
FIG. 3A is a block diagram of another embodiment of a flash device according to the invention.

Referring to FIG. 3A, a block diagram of another embodiment of a flash device 300 according to the invention is shown. The flash device 300 comprises a control IC 302 and two NAND flash ICs 304 and 306. When data is to be written to the NAND flash ICs 304 and 306, the control IC 302 respectively sends write enable signals WE0# and WE1# to the NAND flash ICs 304 and 306 to direct the NAND flash ICs 304 and 306 to write data thereto. When data is to be read from the NAND flash ICs 304 and 306, the control IC 302 respectively sends read enable signals RE0# and RE1# to the NAND flash ICs 304 and 306 to direct the NAND flash ICs 304 and 306 to read data therefrom. Because the NAND flash ICs 304 and 306 have different access timing properties, the control IC 302 generates the write enable signal WE0# corresponding to the NAND flash IC 304 with write timing different from that of the write enable signal WE1# corresponding to the NAND flash IC 306. The NAND flash ICs 304 and 306 therefore have different write timings. In addition, the control IC 302 generates the read enable signal RE0# corresponding to the NAND flash IC 304 with read timing different from that of the read enable signal RE1# corresponding to the NAND flash IC 306. The NAND flash ICs 304 and 306 therefore have different read timings.

Figure 3B:
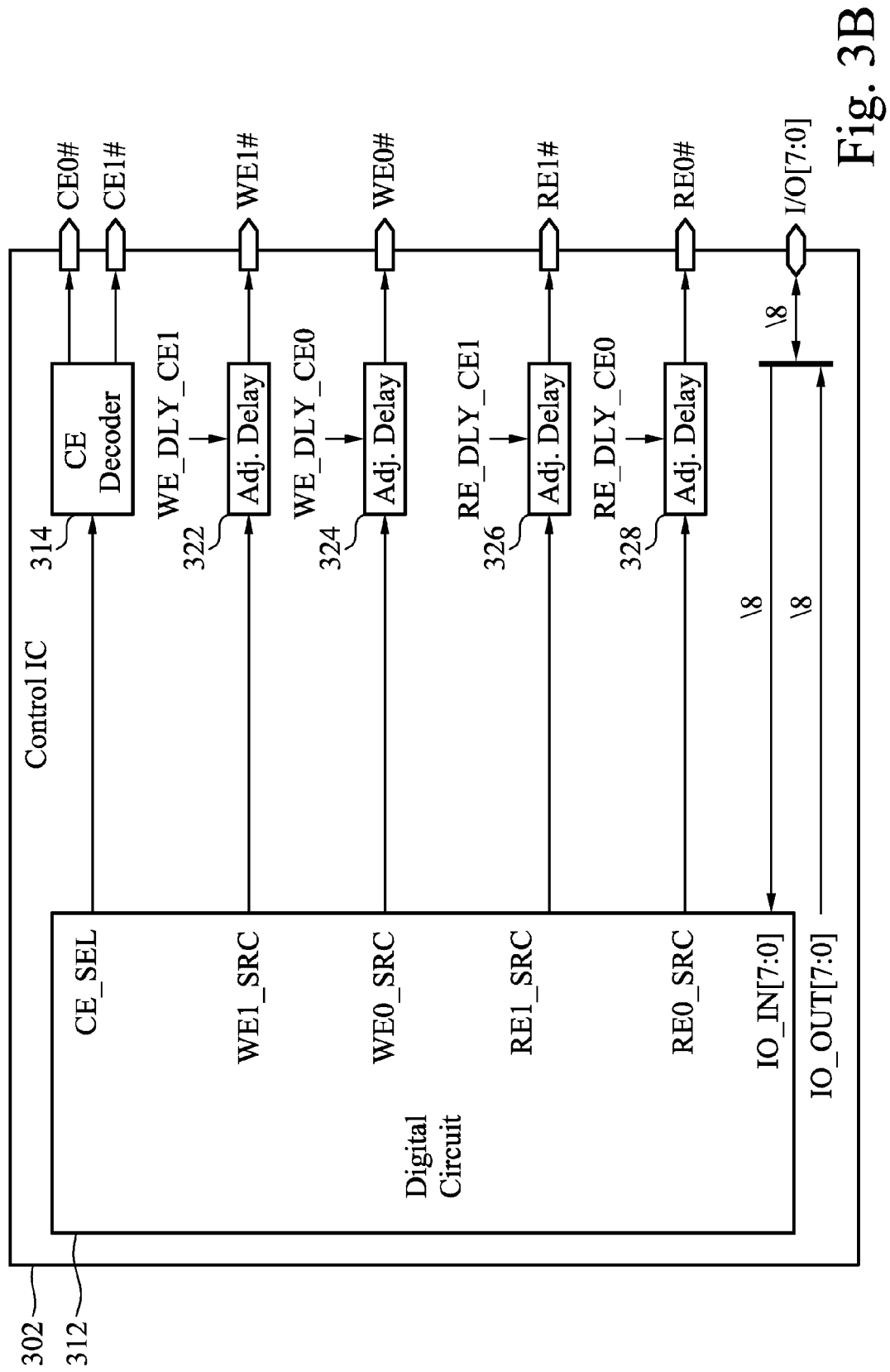
FIG. 3B is a block diagram of an embodiment of a control IC shown in FIG. 3A according to the invention.

Referring to FIG. 3B, a block diagram of an embodiment of the control IC 302 shown in FIG. 3A according to the invention is shown. The control IC 302 comprises a digital circuit 312, a chip enable decoder 314, and four adjustable delay units 322, 324, 326, and 328. the chip enable decoder 314 enables a chip enable signal CE0# when the NAND flash IC 304 of FIG. 3A is accessed, and enables a chip enable signal CE1# when the NAND flash IC 306 is accessed. When data is written to the NAND flash IC 304, the digital circuit 312 generates a write enable source signal WE0_SRC. The adjustable delay unit 324 then delays the write enable source signal WE0_SRC for a write delay period WE_DLY_CE0 to generate a write enable signal WE0# sent to the NAND flash IC 304. When data is written to the NAND flash IC 306, the digital circuit 312 generates a write enable source signal WE1_SRC. The adjustable delay unit 322 then delays the write enable source signal WE1_SRC for a write delay period WE_DLY_CE1 to generate a write enable signal WL1# sent to the NAND flash IC 306. Because the write delay period WE_DLY_CE0 is different from the write delay period WE_DLY_CE1, the NAND flash ICs 304 and 306 are written according to different write timings.

When data is read from the NAND flash IC 304, the digital circuit 312 generates a read enable source signal RE0_SRC. The adjustable delay unit 328 then delays the read enable source signal RE0_SRC for a read delay period RE_DLY_CE0 to generate a read enable signal RE0# sent to the NAND flash IC 304. When data is read from the NAND flash IC 306, the digital circuit 312 generates a read enable source signal RE1_SRC. The adjustable delay unit 326 then delays the read enable source signal RE1_SRC for a read delay period RE_DLY_CE1 to generate a read enable signal RE1# for sending to the NAND flash IC 306. Because the read delay period RE_DLY_CE0 is different from the read delay period RE_DLY_CE1, the NAND flash ICs 304 and 306 are read according to different read timings.

Figure 4A:
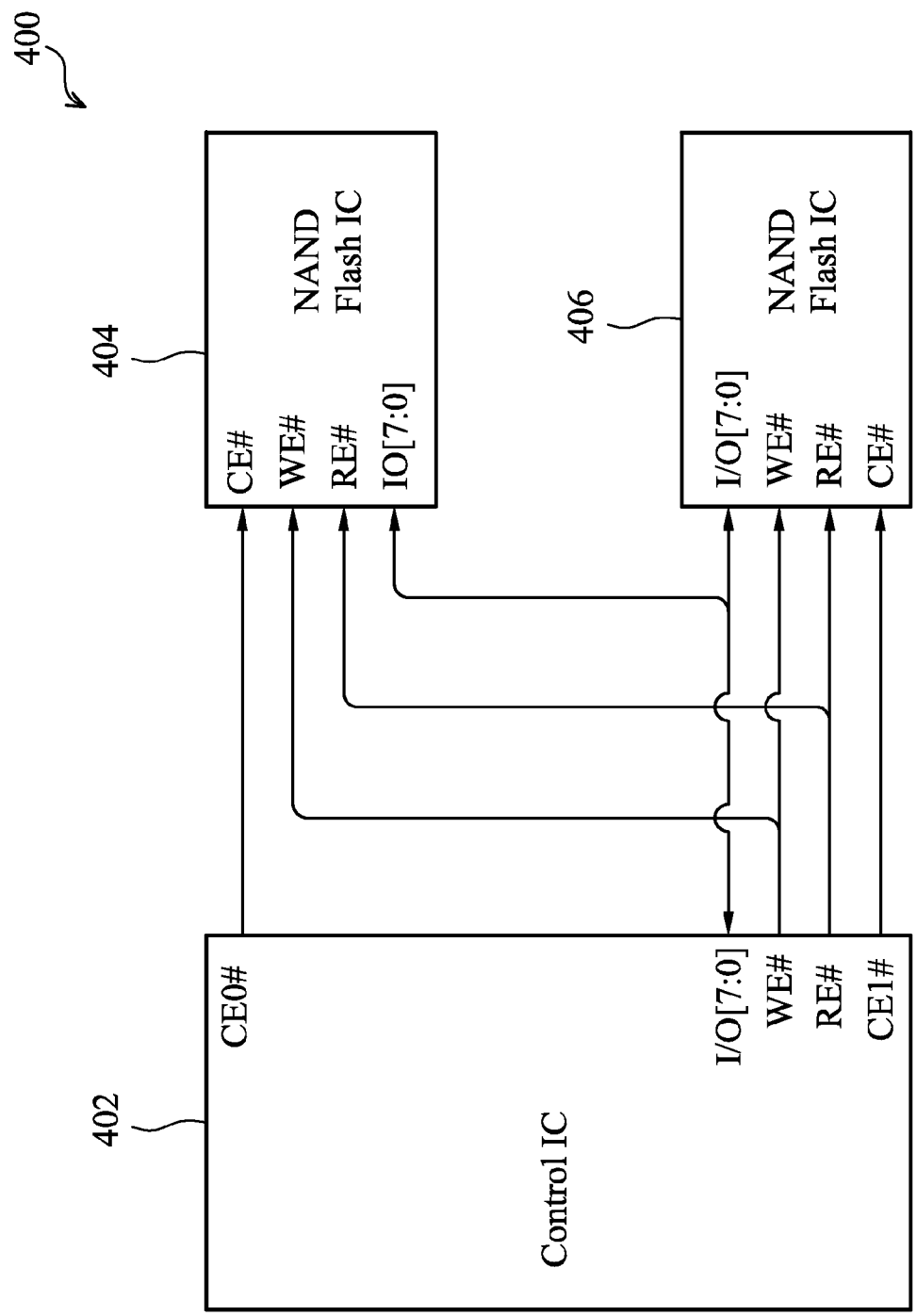
FIG. 4A is a block diagram of another embodiment of a flash device according to the invention.

Referring to FIG. 4A, a block diagram of another embodiment of a flash device 400 according to the invention is shown. The flash device 400 comprises a control IC 402 and two NAND flash ICs 404 and 406. When data is to be written to the NAND flash ICs 404 and 406, the control IC 402 sends a write enable signal WE# to the NAND flash ICs 404 and 406 to direct the NAND flash ICs 404 and 406 to write data thereto. Because the NAND flash ICs 404 and 406 have different access timing properties, the control IC 402 generates the write enable signal WE# sent to the NAND flash IC 404 according to a write timing different from that of the write enable signal WE# sent to the NAND flash IC 406. The NAND flash ICs 404 and 406 therefore have different write timings. When data is to be read from the NAND flash ICs 404 and 406, the control IC 402 sends a read enable signal RE# to the NAND flash ICs 404 and 406 to direct the NAND flash ICs 404 and 406 to read data therefrom. Similarly, the control IC 402 generates the read enable signal RE# sent to the NAND flash IC 404 according to read timing different from that of the read enable signal RE# sent to the NAND flash IC 406. The NAND flash ICs 404 and 406 therefore have different read timings.

Figure 4B:
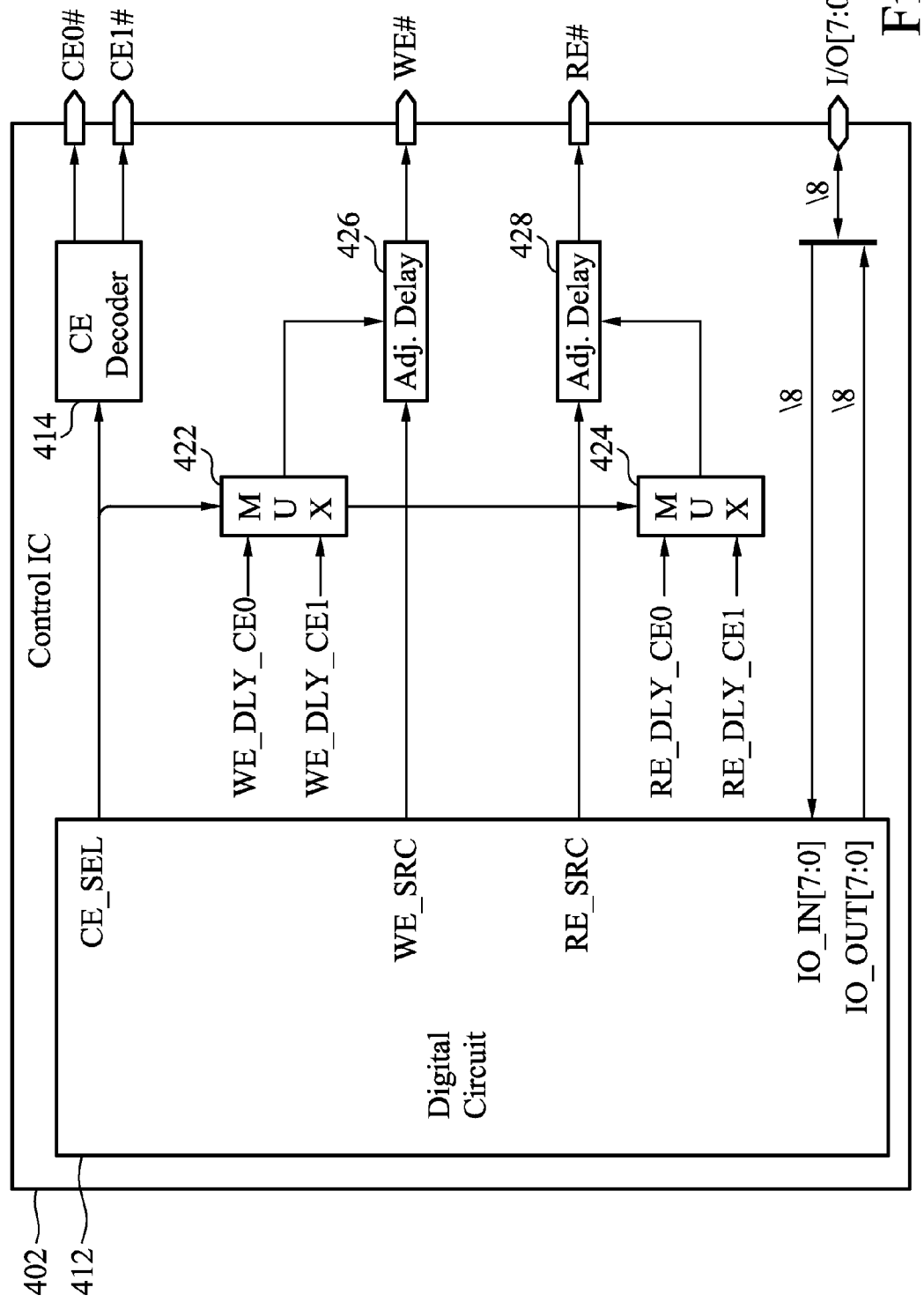
FIG. 4B is a block diagram of an embodiment of a control IC shown in FIG. 4A according to the invention.

Referring to FIG. 4B, a block diagram of an embodiment of the control IC 402 shown in FIG. 4A according to the invention is shown. The control IC 402 comprises a digital circuit 412, two multiplexers 422 and 424, and two adjustable delay units 426 and 428. The digital circuit 412 generates a chip selection signal CE_SEL to indicate which of the NAND flash ICs 404 and 406 is being accessed. When data is written to one of the NAND flash ICs 404 and 406, the digital circuit 412 generates a write enable source signal WE_SRC. The multiplexer 422 then selects a write delay period from a write delay period WE_DLY_CE0 corresponding to the NAND flash 404 and a write delay period WE_DLY_CE1 corresponding to the NAND flash 406 according to the chip selection signal CE_SEL. The adjustable delay unit 426 then delays the write enable source signal WE_SRC for the write delay period output by the multiplexer 422 to generate a write enable signal WE# sent to one of the NAND flash ICs 404 and 406. Because the write delay period WE_DLY_CE0 is different from the write delay period WE_DLY_CE1, the NAND flash ICs 404 and 406 are therefore written according to different write timings.

When data is read from one of the NAND flash ICs 404 and 406, the digital circuit 412 generates a read enable source signal RE_SRC. The multiplexer 424 then selects a read delay period from a read delay period RE_DLY_CE0 corresponding to the NAND flash 404 and a read delay period RE_DLY_CE1 corresponding to the NAND flash 406 according to the chip selection signal CE_SEL. The adjustable delay unit 428 then delays the read enable source signal RE_SRC for the read delay period output by the multiplexer 424 to generate a read enable signal RE# sent to one of the NAND flash ICs 404 and 406. Because the read delay period RE_DLY_CE0 is different from the read delay period RE_DLY_CE1, the NAND flash ICs 404 and 406 are therefore read according to different read timings.

Figure 5A:
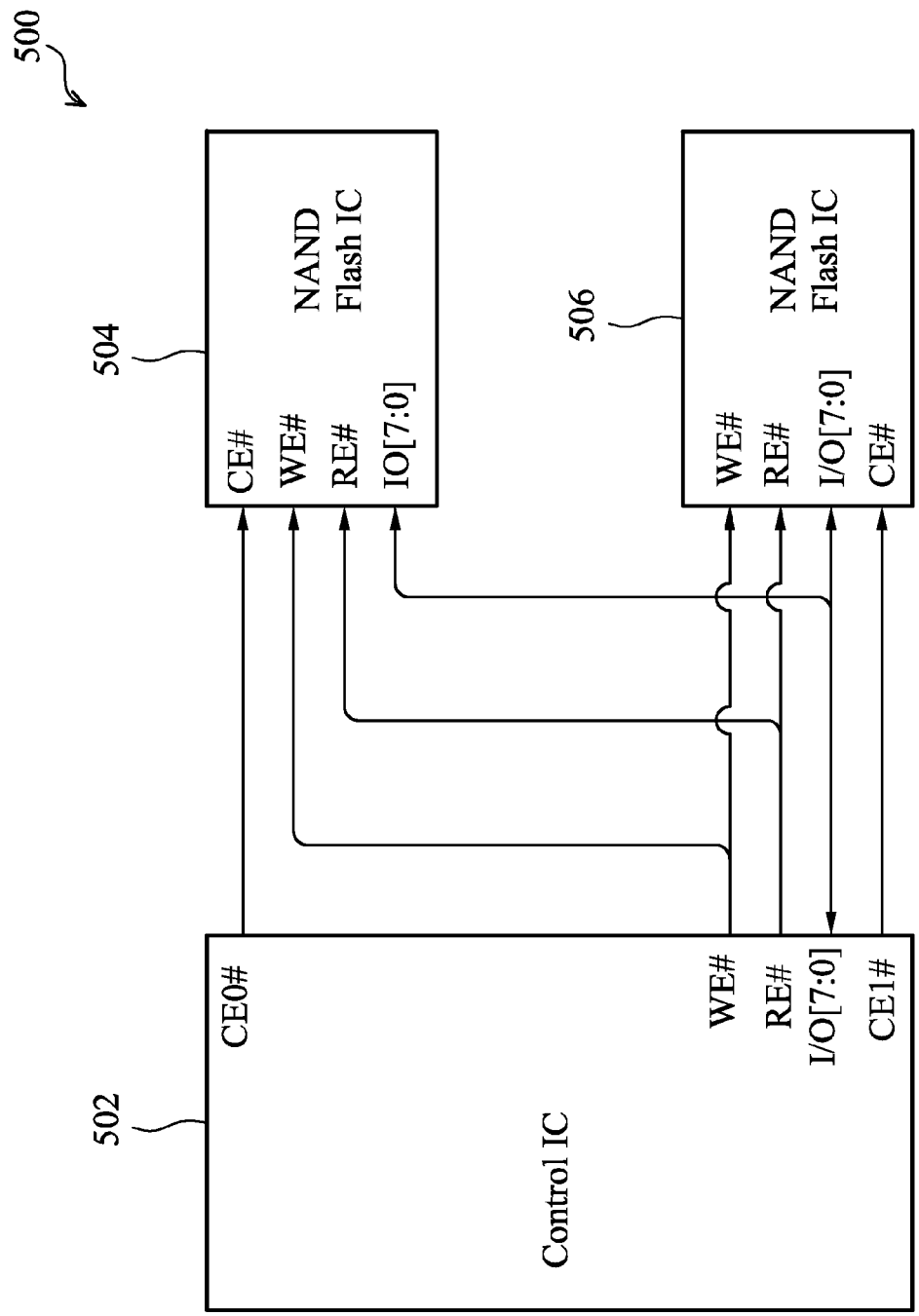
FIG. 5A is a block diagram of another embodiment of a flash device according to the invention.

Referring to FIG. 5A, a block diagram of another embodiment of a flash device 500 according to the invention is shown. The flash device 500 comprises a control IC 502 and two NAND flash ICs 504 and 506. The control IC 502 outputs data to the NAND flash ICs 504 and 506 via the same I/O bus, and receives data from the NAND flash ICs 504 and 506 via the same I/O bus. Because the NAND flash ICs 504 and 506 have different access timing properties, the control IC 502 outputs data to the NAND flash IC 504 with data output timing different from that corresponding to the NAND flash IC 506, and the control IC 502 inputs data from the NAND flash IC 504 with data input timing different from that corresponding to the NAND flash IC 506.

Figure 5B:
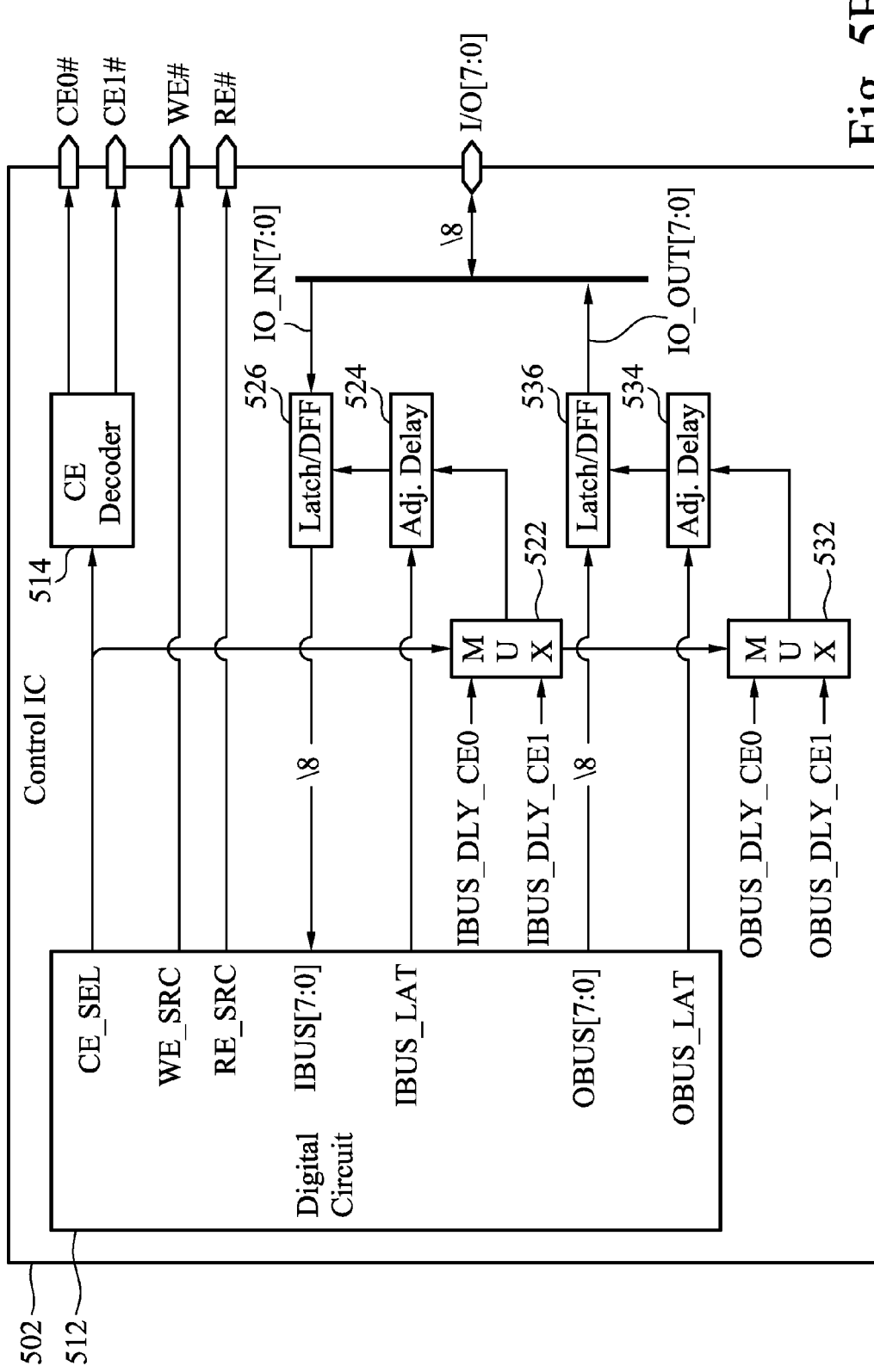
FIG. 5B is a block diagram of an embodiment of a control IC shown in FIG. 5A according to the invention.

Referring to FIG. 5B, a block diagram of an embodiment of the control IC 502 shown in FIG. 5A according to the invention is shown. The control IC 502 comprises a digital circuit 512, two multiplexers 522 and 532, two adjustable delay units 524 and 534, and two latch circuits 526 and 536. The digital circuit 512 generates a chip selection signal CE_SEL to indicate which of the NAND flash ICs 504 and 506 is being accessed. When data is output to one of the NAND flash ICs 504 and 506, the digital circuit 512 generates an output data latch signal OBUS_LAT and a plurality of output data source signals OBUS[7:0] carrying output data. The multiplexer 532 then selects an output data delay period from an output data delay period OBUS_DLY_CE0 corresponding to the NAND flash 504 and a output delay period OBUS_DLY_CE1 corresponding to the NAND flash 506 according to the chip selection signal CE_SEL. The adjustable delay unit 534 then delays the output data latch signal OBUS_LAT for the output data delay period output by the multiplexer 532 to obtain an adjusted output data latch signal, and the latch circuit 536 then latches the output data source signals OBUS[7:0] according to the adjusted output data latch signal to obtain a plurality of output data signals IO_OUT [7:0] sent to one of the NAND flash ICs 504 and 506 via the I/O bus. Because the output data delay period OBUS_DLY_CE0 is different from the output data delay period OBUS_DLY_CE1, the NAND flash ICs 504 and 506 therefore receive data output according to different data output timings.

When data is received from one of the NAND flash ICs 504 and 506, the digital circuit 512 generates an input data latch signal IBUS_LAT. The multiplexer 522 then selects an input data delay period from an input data delay period IBUS_DLY_CE0 corresponding to the NAND flash 504 and an input delay period IBUS_DLY_CE1 corresponding to the NAND flash 506 according to the chip selection signal CE_SEL. The adjustable delay unit 524 then delays the input data latch signal IBUS_LAT for the input data delay period output by the multiplexer 522 to obtain an adjusted input data latch signal. When one of the NAND flash ICs 504 and 506 sends a plurality of input data signals carrying input data to the control IC 502 via the I/O bus, the latch circuit 526 then latches the input data signals IO_IN [7:0] according to the adjusted input data latch signal to obtain a plurality of input data source signals IBUS[7:0] sent to the digital circuit 512. Because the input data delay period IBUS_DLY_CE0 is different from the input data delay period IBUS_DLY_CE1, the control IC 502 therefore can receive data generated by the NAND flash ICs 504 and 506 with different data input timings.

Figures 6A, 6B:
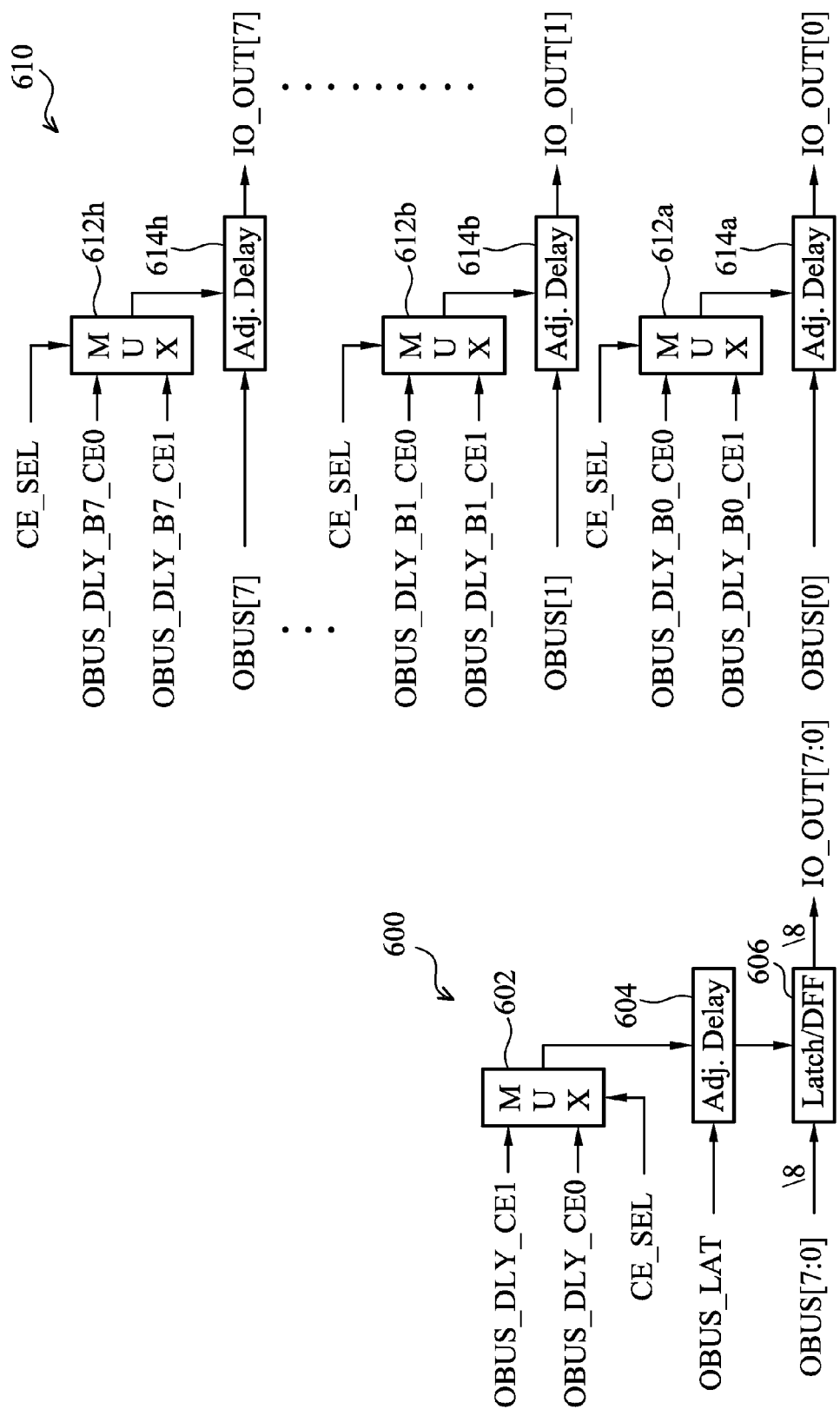
FIGS. 6A~6C show block diagrams of embodiments of an output delay circuit for delaying a plurality of output data source signals generated by a digital circuit shown in FIG. 5B for an output data delay period to obtain a plurality of output data signals sent to NAND flash ICs shown in FIG. 5B.

FIG. 6A shows an embodiment of an output delay circuit 600 for delaying a plurality of output data source signals OBUS[7:0] generated by a digital circuit 512 of FIG. 5B for an output data delay period to obtain output data signals IO_OUT [7:0] sent to one of the NAND flash ICs 504 and 506. A multiplexer 602, an adjustable delay unit 604, and a latch circuit 606 shown in FIG. 6A respectively correspond to the multiplexer 532, the adjustable delay unit 534, and the latch circuit 536 shown in FIG. 5B. The output delay circuit 600, however, cannot delay different output data source signals OBUS[7:0] for different output data delay periods.

Referring to FIG. 6B, another embodiment of am output delay circuit 610 for delaying different output data source signals OBUS[0]~OBUS[7] generated by a digital circuit 512 of FIG. 5B for different output data delay periods to obtain output data signals IO_OUT[0]~IO_OUT[7] sent to one of the NAND flash ICs 504 and 506 is shown. For example, a multiplexer 612a corresponding to the output data source signals OBUS[0] selects an output data delay period from the value OBUS_DLY_B0_CE0 corresponding to the NAND flash IC 504 and the value OBUS_DLY_B1_CE0 corresponding to the NAND flash IC 506 according to the chip selection signal CE_SEL generated by the digital circuit 512. The adjustable delay unit 614a then delays the output data source signals OBUS[0] for the output data delay period output by the multiplexer 612a to obtain the output data signal IO_OUT[0] sent to the NAND flash IC 504 or 506. Because the output data delay periods corresponding to different output data source signals OBUS[0]~OBUS[7] can be independently assigned, the output delay circuit 610 shown in FIG. 6B can compensate the output data source signals OBUS[0]~OBUS[7] for a bus skew.

Figure 6C:
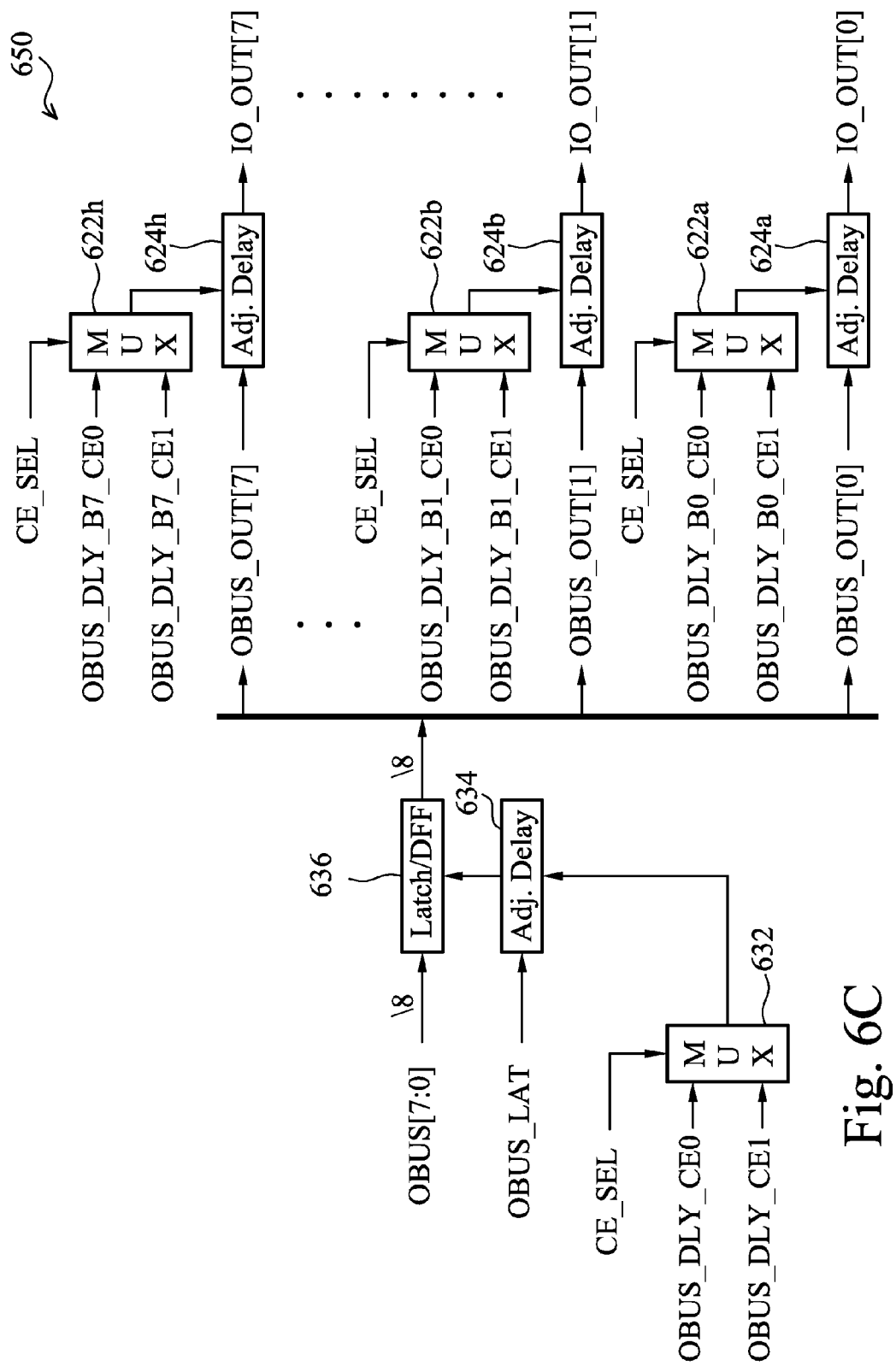

Referring to FIG. 6C, another embodiment of an output delay circuit 650 for delaying a plurality of output data source signals OBUS[7:0] generated by a digital circuit 512 of FIG. 5B for different output data delay periods to obtain output data signals IO_OUT[0]~IO_OUT[7] sent to one of the NAND flash ICs 504 and 506 is shown. The output delay circuit 650 is a combination of the output delay circuits 600 and 610. A left-side portion circuit comprising a multiplexer 632, an adjustable delay unit 634, and a latch circuit 636 is similar to the output delay circuit 600 for delaying the output data source signals OBUS[7:0] for a common delay period to obtain signals OBUS_OUT[0]~OBUS_OUT[7], and a right-side portion circuit comprising multiplexers 622a-622h and adjustable delay units 624a-624h is similar to the output delay circuit 610 for delaying signals OBUS_OUT[0]~OBUS_OUT[7] for different delay periods to obtain the output data signals IO_OUT[0]~IO_OUT[7].

Figures 7A, 7B:
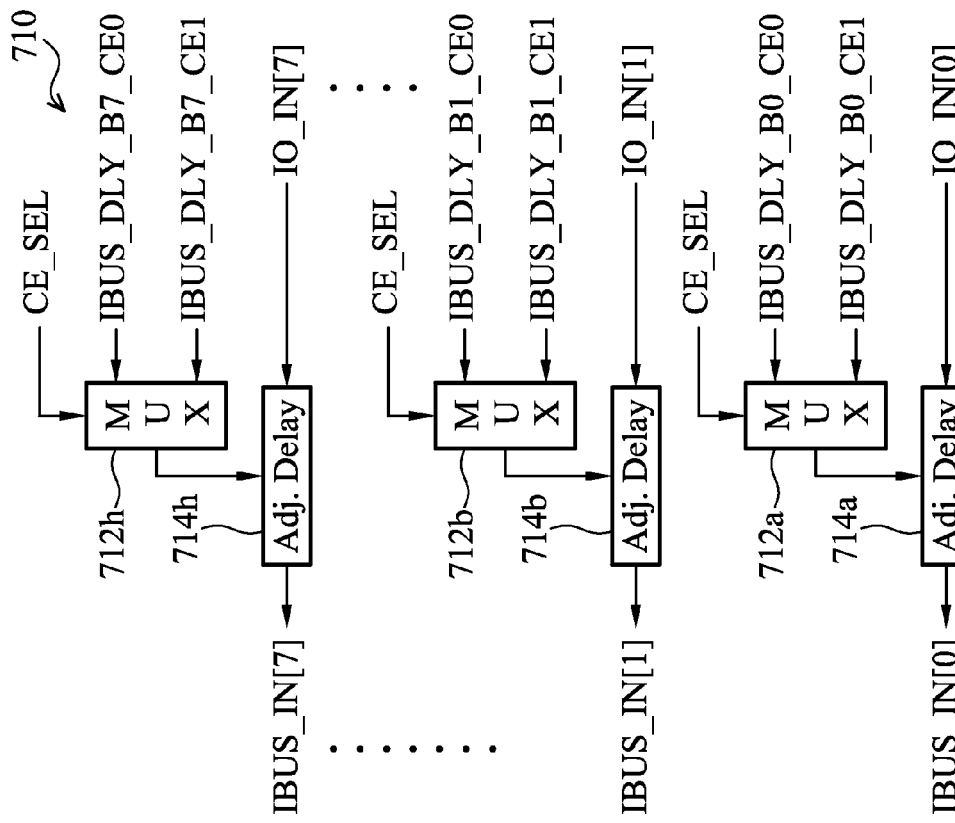
FIGS. 7A~7C show embodiments of input delay circuits for delaying a plurality of input data signals generated by NAND flash ICs shown in FIG. 5B for an input data delay period to obtain a plurality of input data source signals received by a digital circuit shown in FIG. 5B.
Figure 7C:
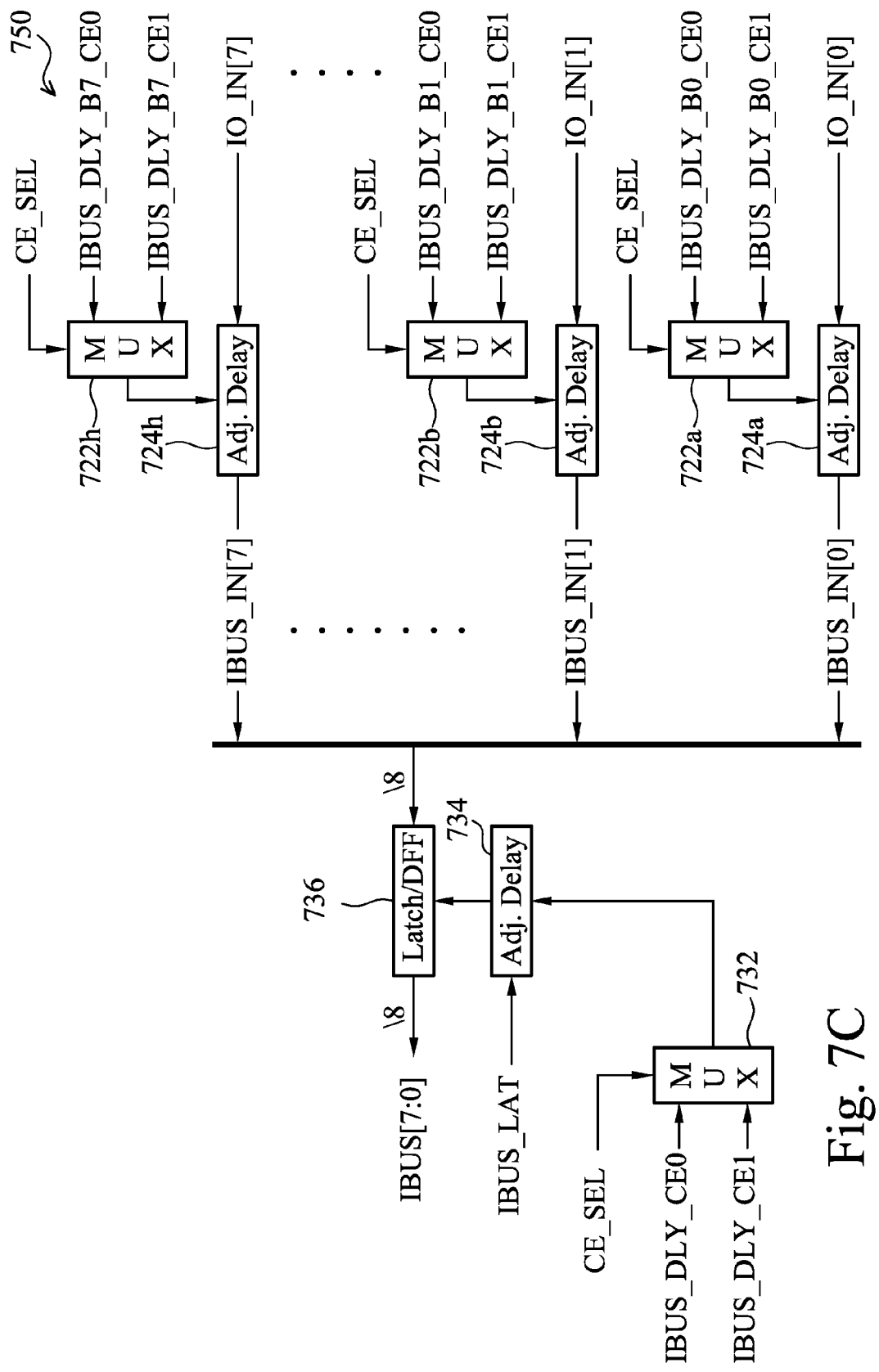

FIGS. 7A, 7B, and 7C respectively show embodiments of input delay circuits 700, 710, and 750 for delaying a plurality of input data signals IO_IN[7:0] generated by the NAND flash IC 504 or 506 for an input data delay period to obtain input data source signals I_BUS [7:0] received by a digital circuit 512 of FIG. 5B. The embodiments of the input delay circuits 700, 710, and 750 respectively corresponds to the embodiments of the output delay circuits 600, 610, and 650 shown in FIGS. 6A, 6B, and 6C.

Figure 8A:
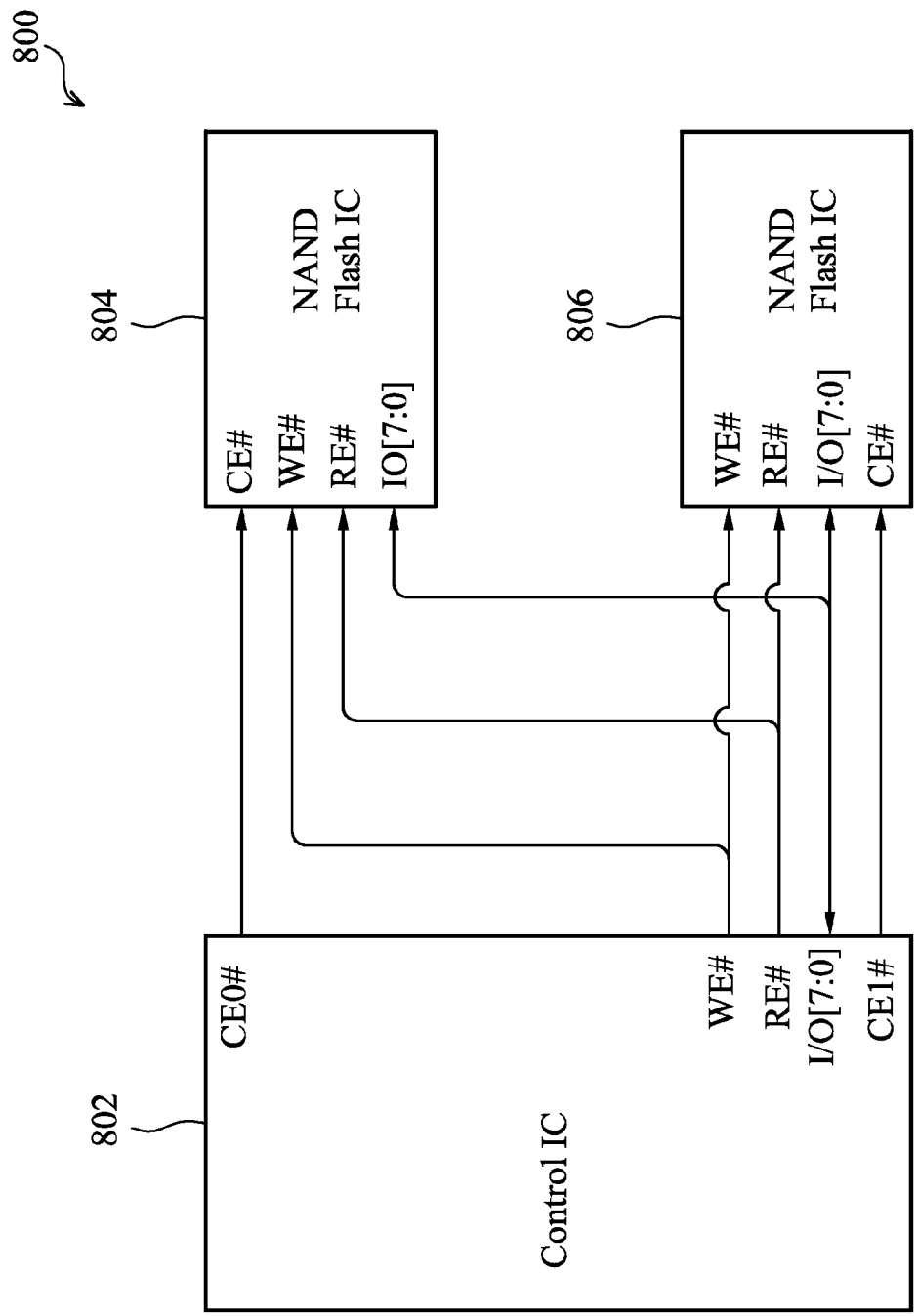
FIG. 8A is a block diagram of another embodiment of a flash device according to the invention.

Referring to FIG. 8A, a block diagram of another embodiment of a flash device 800 according to the invention is shown. The flash device 800 comprises a control IC 802 and two NAND flash ICs 804 and 806. The control IC 802 sends a write enable signal WE# to the NAND flash ICs 804 and 806 with different write timings, and sends a read enable signal RE# to the NAND flash ICs 804 and 806 with different read timings. In addition, the IO bus transmits data between the control IC 802 and one of the NAND flash ICs 804 and 806 with different data input/output timings according to which one of the NAND flash ICs 804 and 806 is being accessed.

Figure 8B:
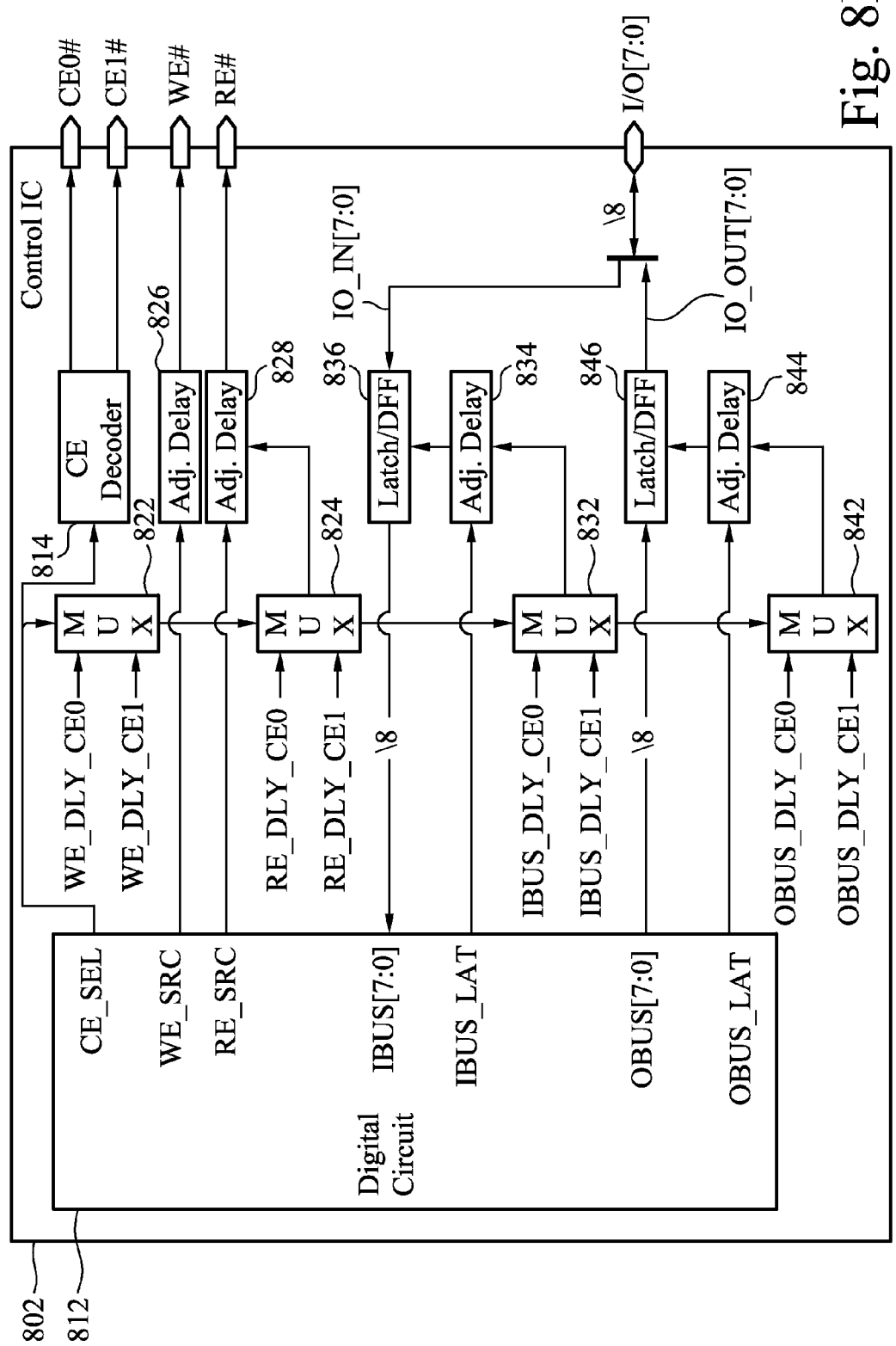
FIG. 8B is a block diagram of an embodiment of a control IC shown in FIG. 8A according to the invention.

Referring to FIG. 8B, a block diagram of an embodiment of the control IC 802 shown in FIG. 8A according to the invention is shown. The control IC 802 shown in FIG. 8B in fact combines the control IC 402 shown in FIG. 4B with the control IC 502 shown in FIG. 5B. Multiplexers 822 and 824 and adjustable delay units 826 and 828 respectively correspond to multiplexers 422 and 424 and adjustable delay units 426 and 428 shown in FIG. 4B. Multiplexers 832 and 842, adjustable delay units 834 and 844, and latch circuits 836 and 846 respectively correspond to multiplexers 522 and 532, adjustable delay units 524 and 534, and latch circuits 526 and 536 shown in FIG. 5B.

Figure 9A:
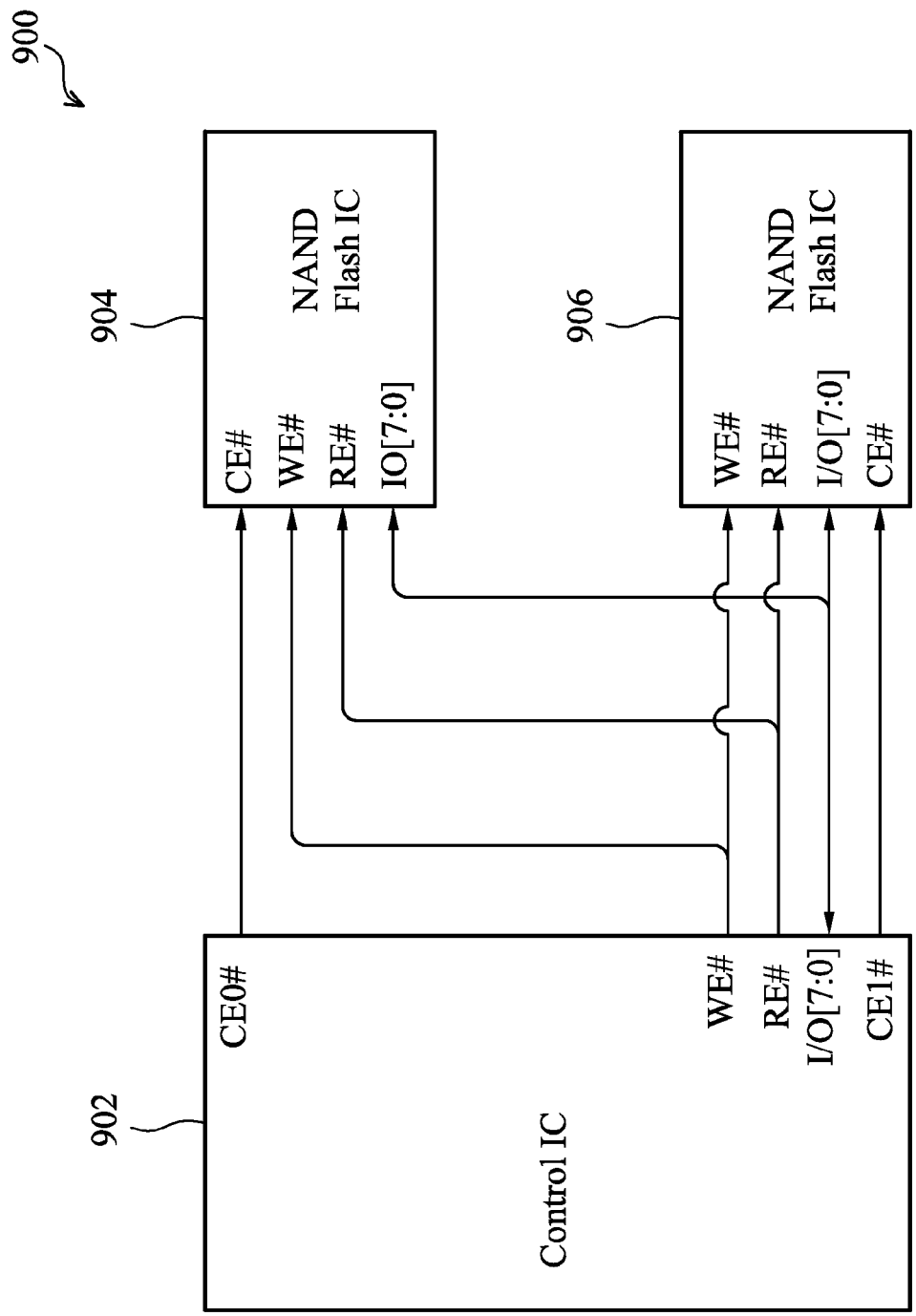
FIG. 9A is a block diagram of another embodiment of a flash device according to the invention.

Referring to FIG. 9A, a block diagram of another embodiment of a flash device 900 according to the invention is shown. The flash device 900 comprises a control IC 902 and two NAND flash ICs 904 and 906. When the control IC 902 sends a write enable signal WE# or a read enable signal RE# to the NAND flash IC 904 or 906, the NAND flash IC 904 and 906 automatically adjusts timings of the write enable signal WE# or the read enable signal RE# to obtain an adjusted write enable signal or an adjusted read enable signal, and then accesses data stored therein according to the adjusted write enable signal or the adjusted read enable signal. In addition, when the NAND flash IC 904 and 906 receive input data signal from the control IC 902 or send output data signal to the control IC 902, the NAND flash ICs 904 and 906 automatically adjusts timings of the input data signal or the output data signal.

Figure 9B:
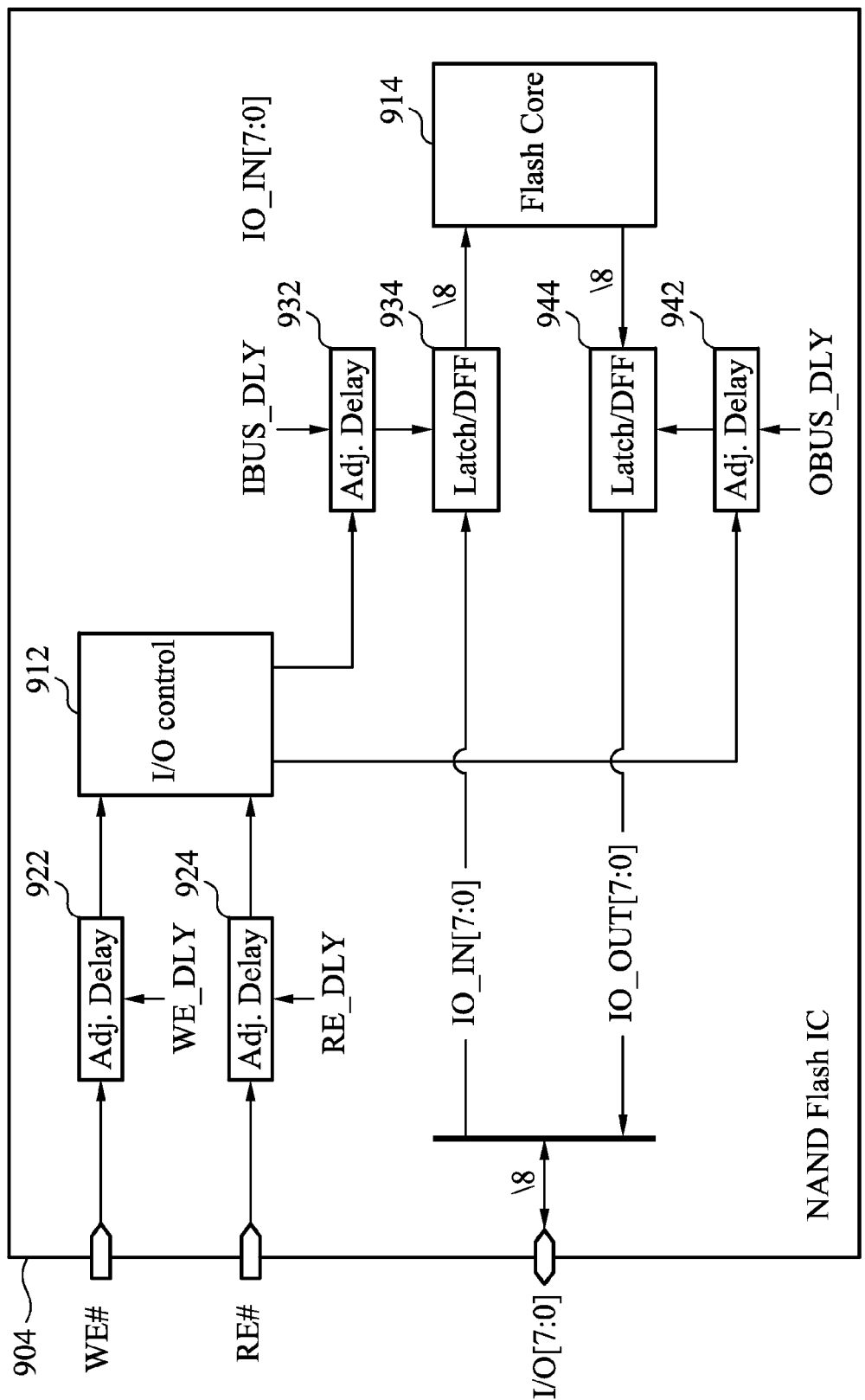
FIG. 9B is a block diagram of an embodiment of a control IC shown in FIG. 9A according to the invention.

Referring to FIG. 9B, a block diagram of an embodiment of the NAND flash IC 904 or 906 shown in FIG. 9A according to the invention is shown. Adjustable delay units 922 and 924 respectively delay the write enable signal WE# and the read enable signal RE# for a write delay period WE_DLY and a read delay period RE_DLY to obtain an adjusted write enable signal and an adjusted read enable signal sent to an I/O control circuit 912. Adjustable delay units 932 and 934 respectively delay an input latch signal and an output latch signal generated by the I/O control circuit 912 for an input data delay period IBUS_DLY and an output data delay period OBUS_DLY to obtain an adjusted input latch signal and an adjusted output latch signal., and the latch circuits 934 and 944 then respectively latch input data and output data according to the adjusted input latch signal and the adjusted output latch signal.

Figure 10A:
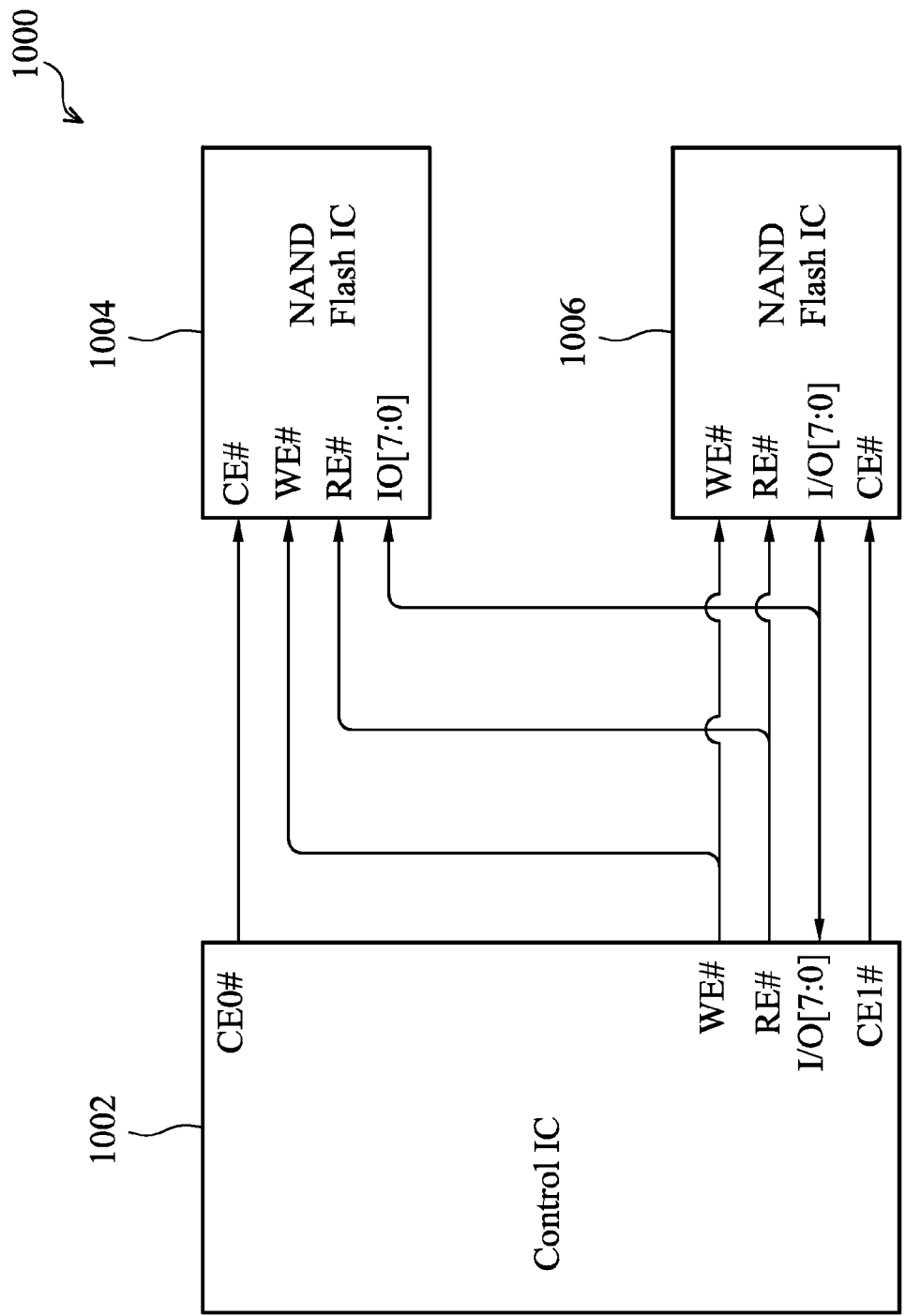
FIG. 10A is a block diagram of another embodiment of a flash device according to the invention.

Referring to FIG. 10A, a block diagram of another embodiment of a flash device 1000 according to the invention is shown. The flash device 1000 comprises a control IC 1002 and two NAND flash ICs 1004 and 1006. When the control IC 1002 sends a write enable signal WE# or a read enable signal RE# to the NAND flash IC 1004 or 1006, the control IC 1002 automatically adjusts current levels of the write enable signal WE# or the read enable signal RE# according to which one of the NAND flash ICs 1004 and 1006 is being accessed. In addition, when the control IC 1002 transmits output data signals to the NAND flash IC 1004 and 1006 or receives input data signals from NAND flash IC 1004 and 1006, the control ICs 1002 automatically current levels of the input data signals or the output data signals according to which one of the NAND flash ICs 1004 and 1006 is being accessed.

Figure 10B:
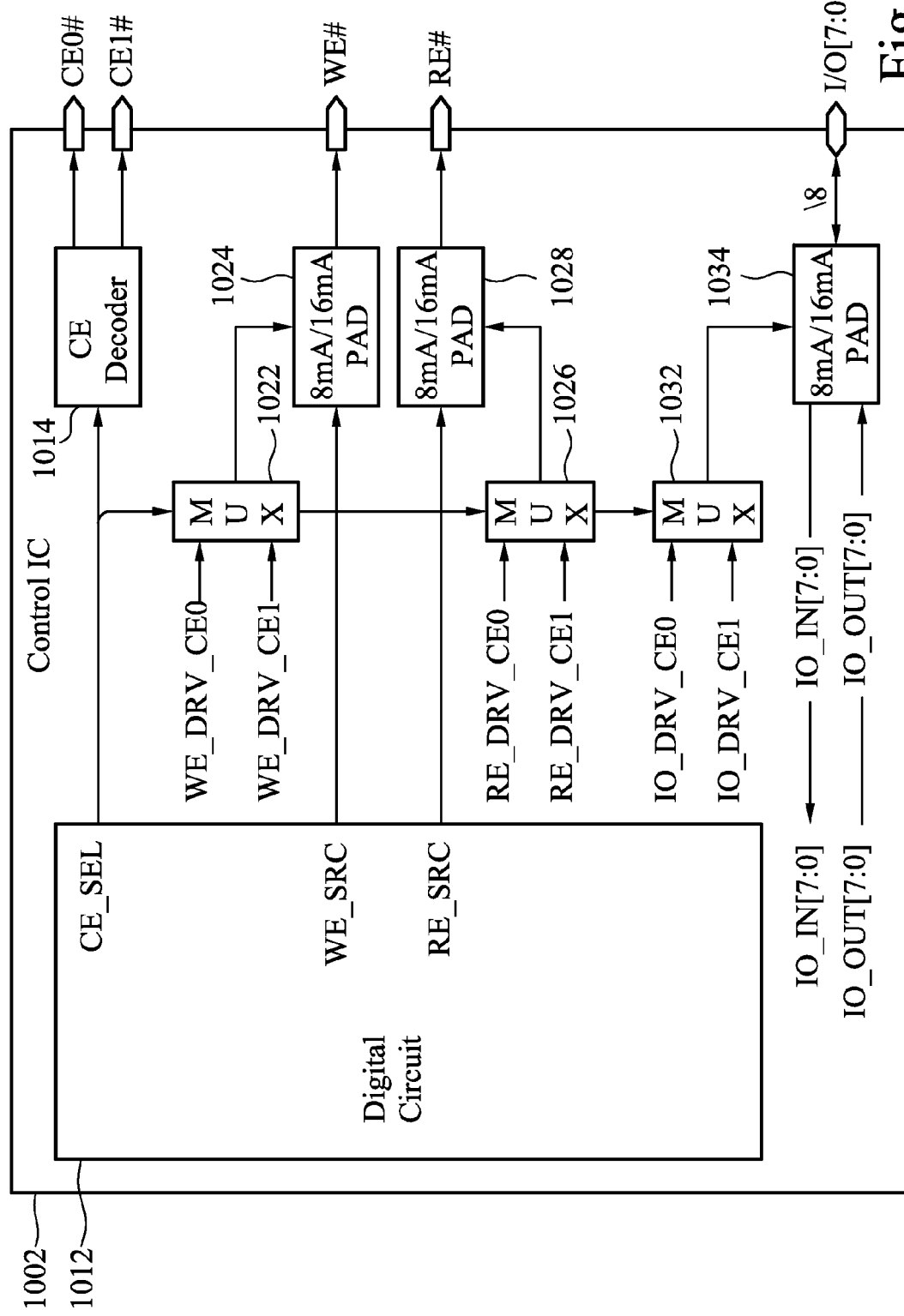
FIG. 10B is a block diagram of an embodiment of a control IC shown in FIG. 9A according to the invention.

Referring to FIG. 10B, a block diagram of an embodiment of the control IC 1002 shown in FIG. 10A according to the invention is shown. Multiplexers 1022 and 1026 respectively determine driving current levels of the write enable signal WE# and the read enable signal RE# according to a chip selection signal CE_SEL, and bus current drivers 1024 and 1028 respectively generate the write enable signal WE# and the read enable signal RE# according to driving current levels determined by the multiplexers 1002 and 1026. Similarly, a multiplexer 1032 determines a driving current level of an I/O bus I/O[7:0] for transmitting output data or receiving input data according to the chip selection signal CE_SEL, and bus current drivers 1034 respectively drive the I/O bus I/O[7:0] according to driving current levels determined by the multiplexers 1032.

Figure 1A:
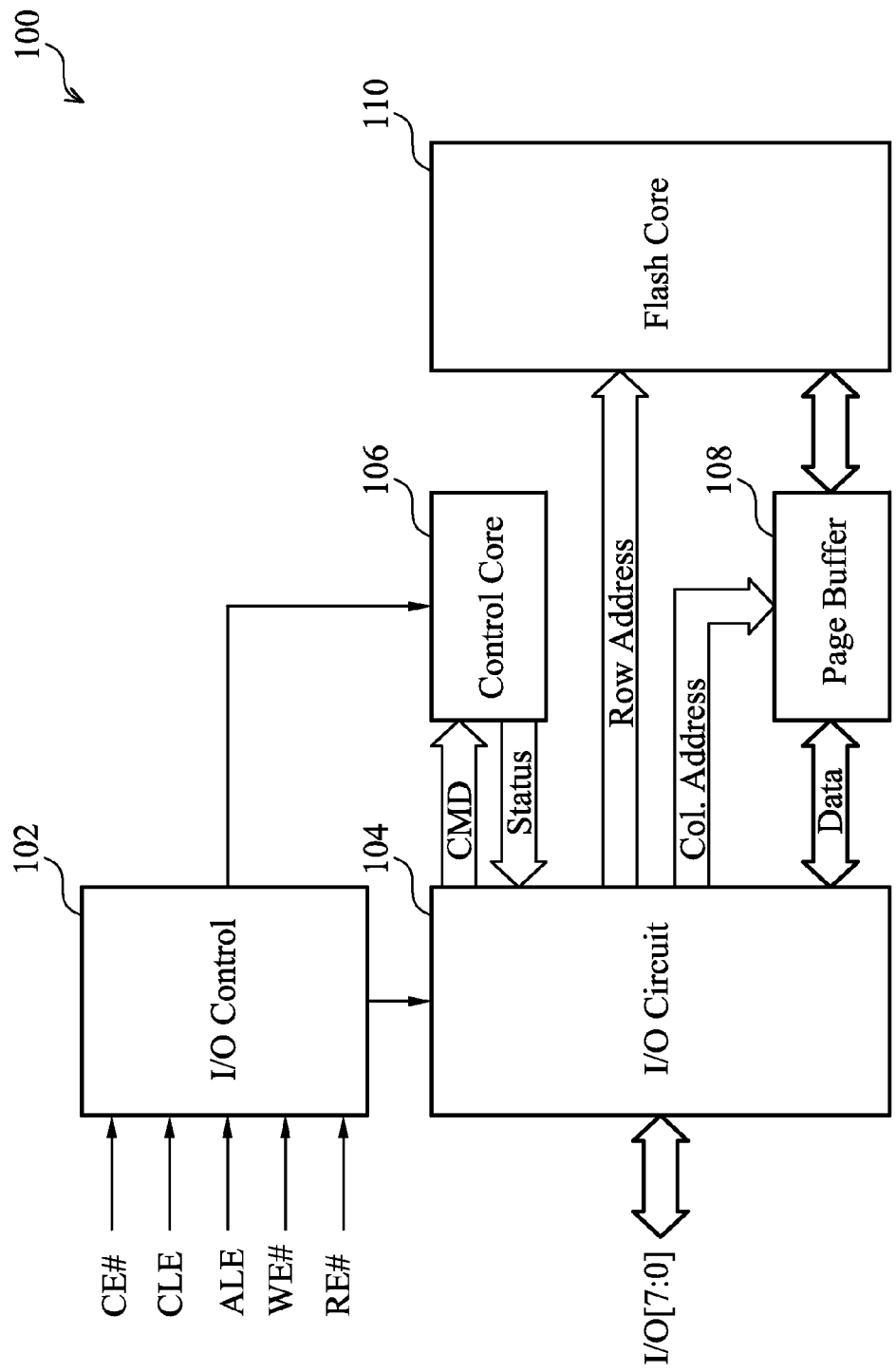
FIG. 1A is a block diagram of a NAND flash integrated circuit.
Figure 1C:
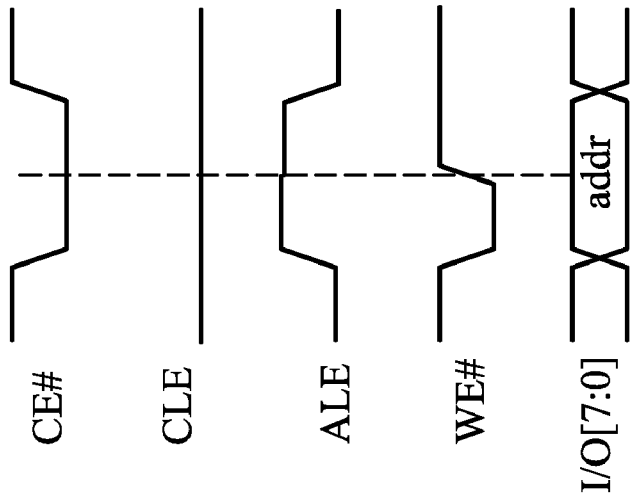
FIGS. 1B and 1C show timings of access signals CE#, CLE, ALE, WE#, and an I/O bus for directing a NAND flash IC to receive commands and addresses from a control IC.
Figure 1B:
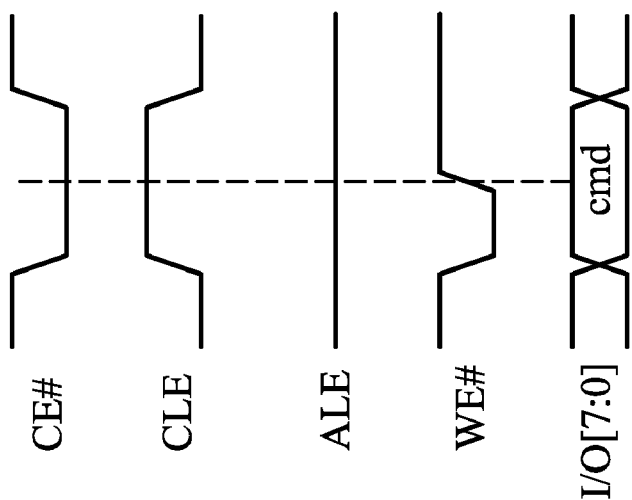
Figure 1E:
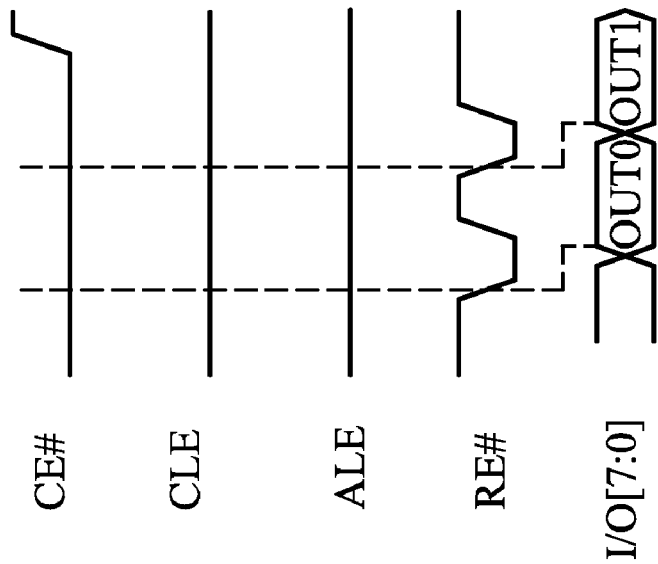
FIGS. 1D and 1E show timings of access signals CE#, CLE, ALE, WE#, RE#, and an I/O bus for directing a NAND flash IC to receive data written thereto or receive data read therefrom.
Figure 1D:
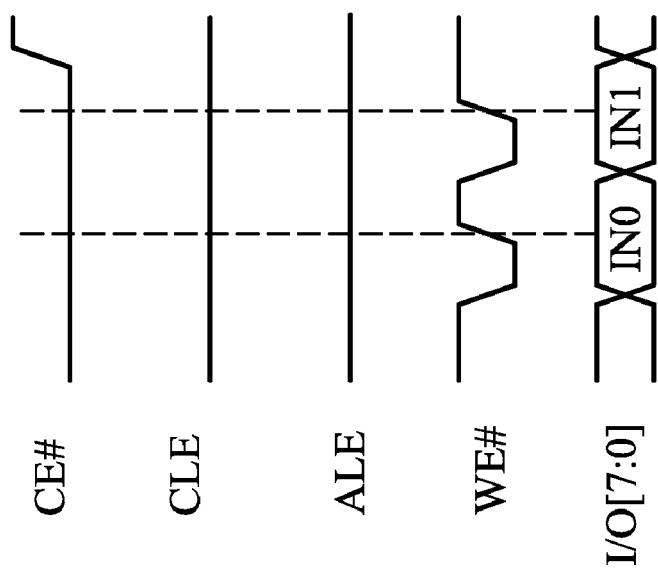
Figure 11A:
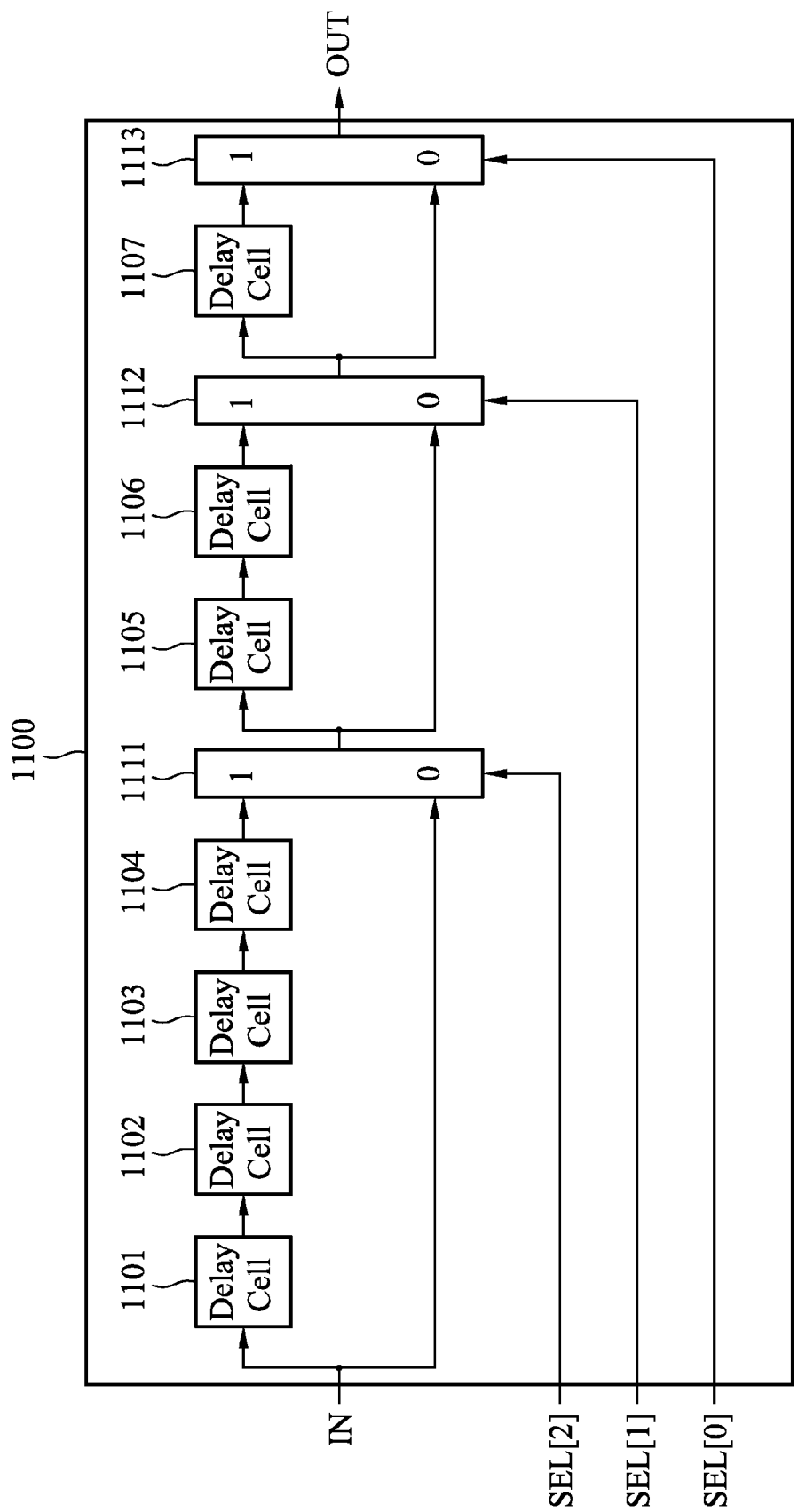
Figure 11B:
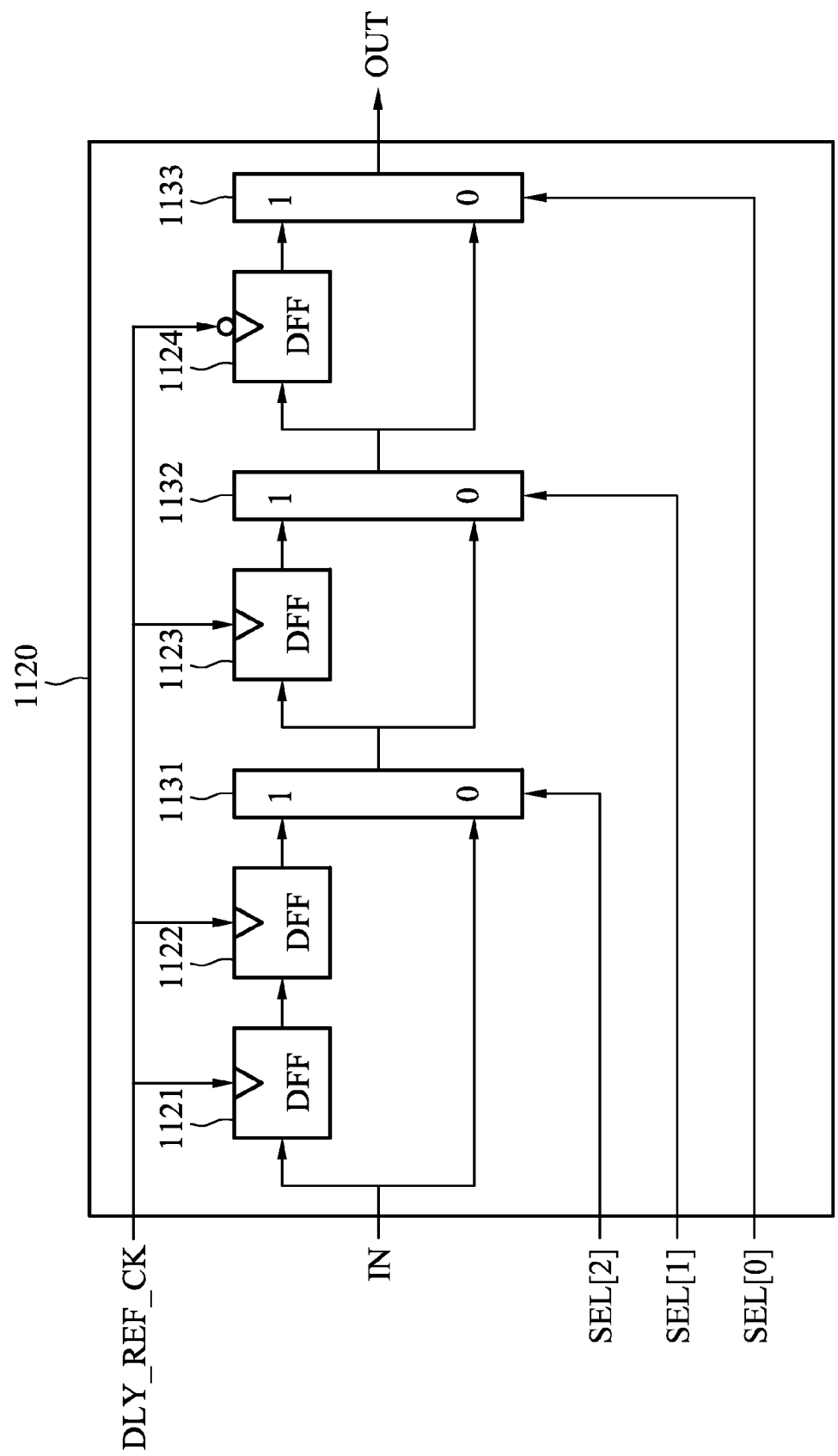

Referring to FIGS. 11A, 11B, and 11C, block diagrams of three embodiments of adjustable delay units 1100, 1120, and 1140 according to the invention is shown. The adjustable delay unit 1100 shown in FIG. 11A is made up of three stages of delay cells. Delay cells 1101~1104, 1105~1106, and 1107 respectively delay an input signal for four clock cycles, two clock cycle, and one clock cycle. The selection signals SEL [0]~SEL[2] determine whether an input signal IN will pass the delay cells 1101~1104, 1105~1106, and 1107. An output signal OUT therefore has different delay periods determined by the selection signals SEL[0]~SEL[2]. The adjustable delay unit 1120 shown in FIG. 1B is made up of three stages of D-type flip-flops. The D-type flip-flops 1121-1122, 1123, and 1124 latches input signals thereof according to a reference clock signal DLY_REF_CK with a frequency higher than that of an operating clock signal of NAND flash ICs. The selection signals SEL[0]~SEL[2] determine whether an input signal IN will pass the D-type flip-flops 1121-1122, 1123, and 1124. An output signal OUT therefore has different delay periods determined by the selection signals SEL[0]~SEL[2]. The adjustable delay unit 1140 comprises a multiplexer 1142 and a D-type flip-flop 1144. Four reference clocks REF_PH0_CK~REF_PH3_CK shown in FIG. 11D have different phases. The multiplexer 1142 selects a reference clock from the four reference clocks REF_PH0_CK~REF_PH3_CK, and the D-type flip-flop 1144 latches the input signals IN according to the reference clock selected by the multiplexer 1142 to obtain the output signal OUT.

The embodiments of the control ICs shown in FIGS. 3B, 4B, 5B, and 8B delay a write enable signal, a read input signal, or input/output data signals for different delay periods according to the accessed NAND flash IC. A delay period value for a signal accessing a NAND flash IC can be determined by an on-line calibration process or an off-line calibration process. To determine a write delay period corresponding to a target NAND flash IC, test data is first written to a page buffer of the target NAND flash IC with different trial write delay periods. The test data is then read back from the page buffer of the target NAND flash IC to determine which of the trial write delay periods allows the target NAND flash IC to have the best performance. To determine a read delay period corresponding to a target NAND flash IC, test data is first written to a page buffer of the target NAND flash IC, and the test data is then read back from the page buffer of the target NAND flash IC with different trial read delay periods to determine which of the trial read delay periods allows the target NAND flash IC to have the best performance.

Figure 12A:
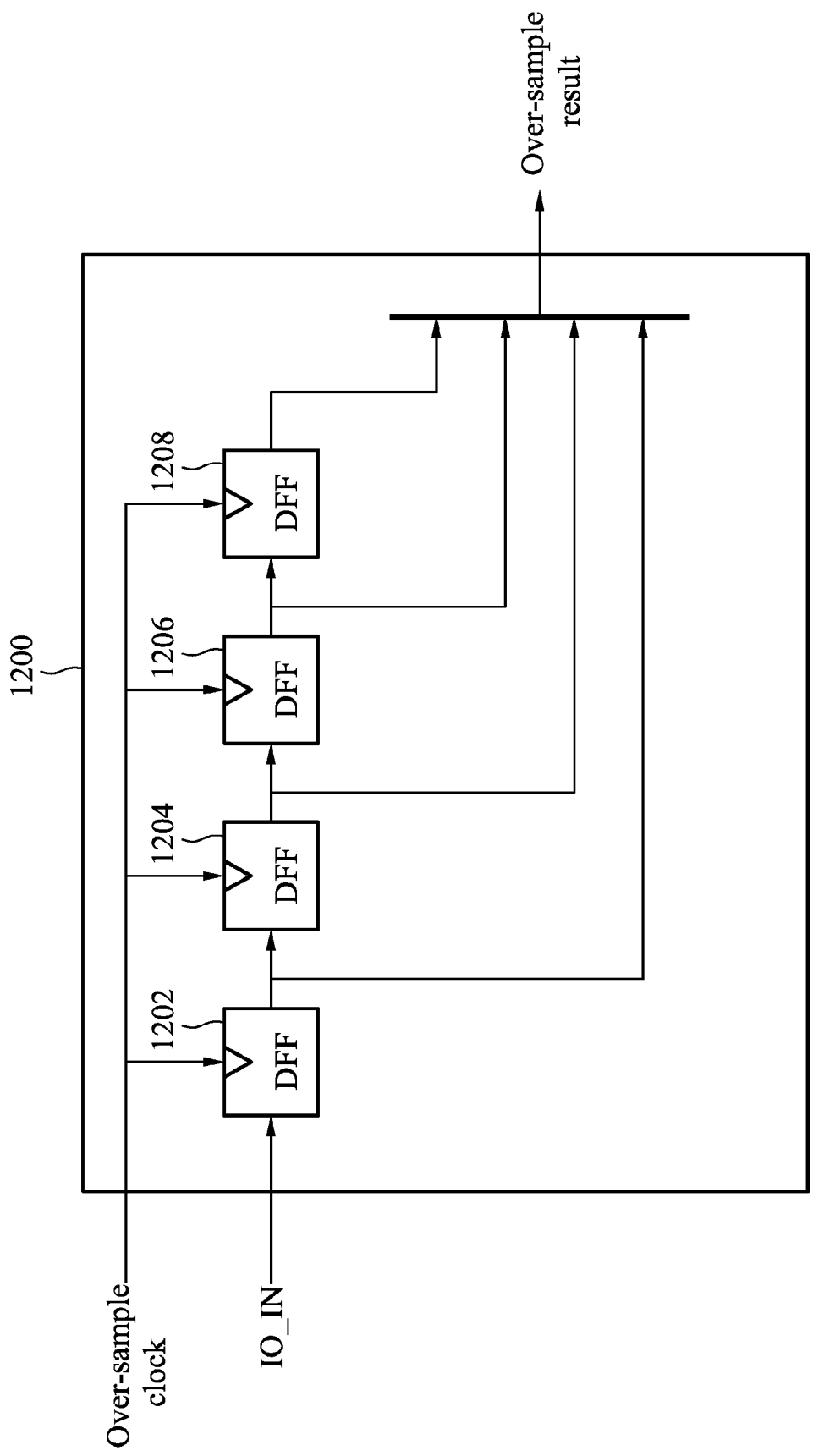
FIGS. 12A~12G are block diagrams of embodiments of an over-sampling circuit for over-sampling an IO-pin of a NAND flash IC according to the invention.
Figure 12C:
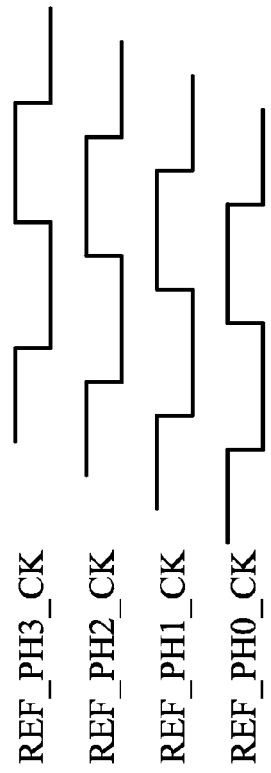
Figure 12B:
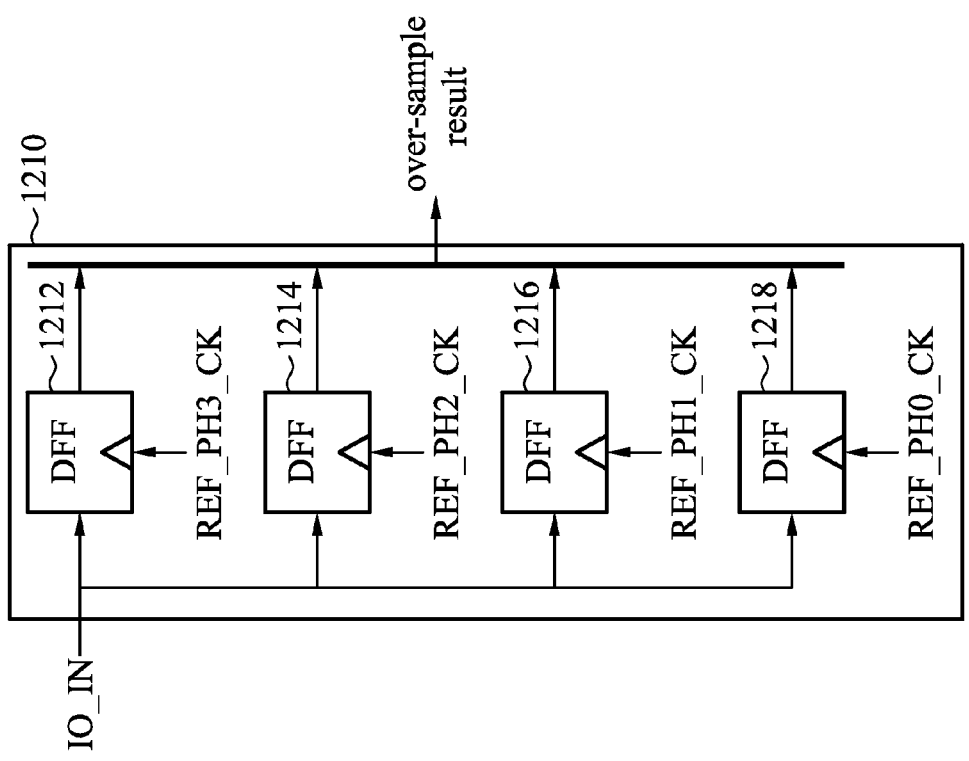
Figure 12D:
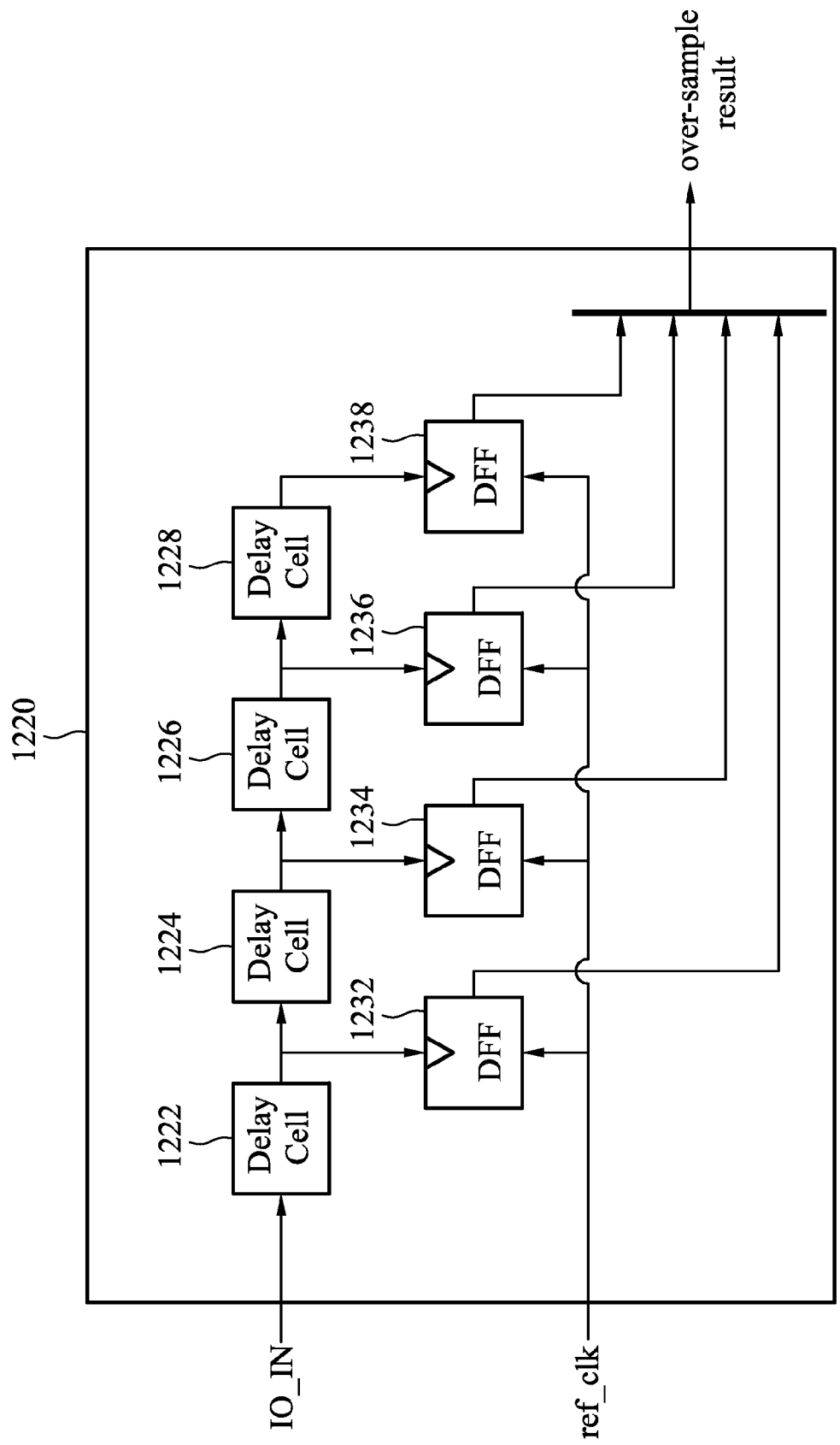
Figures 12E, 12F:
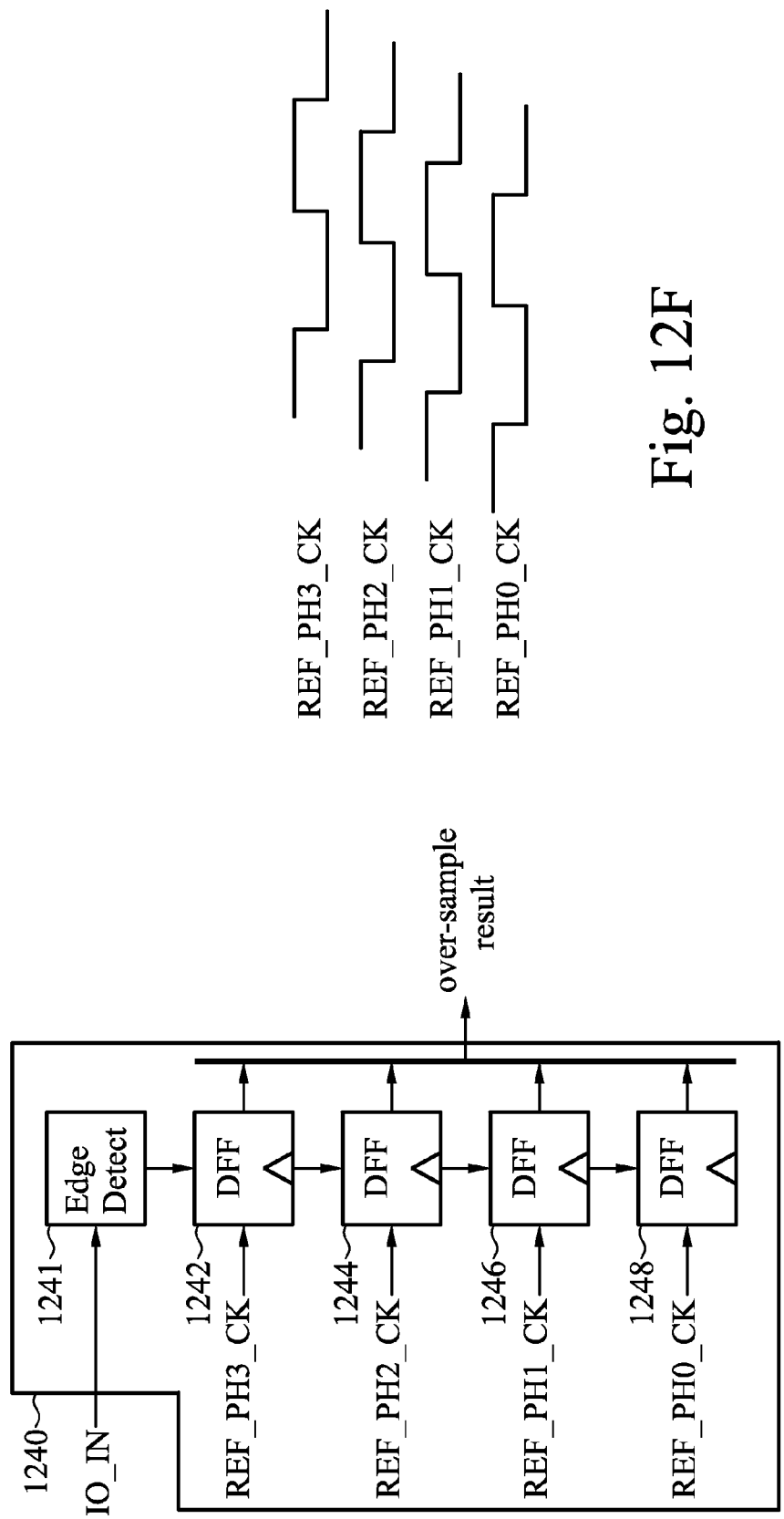
Figure 12G:
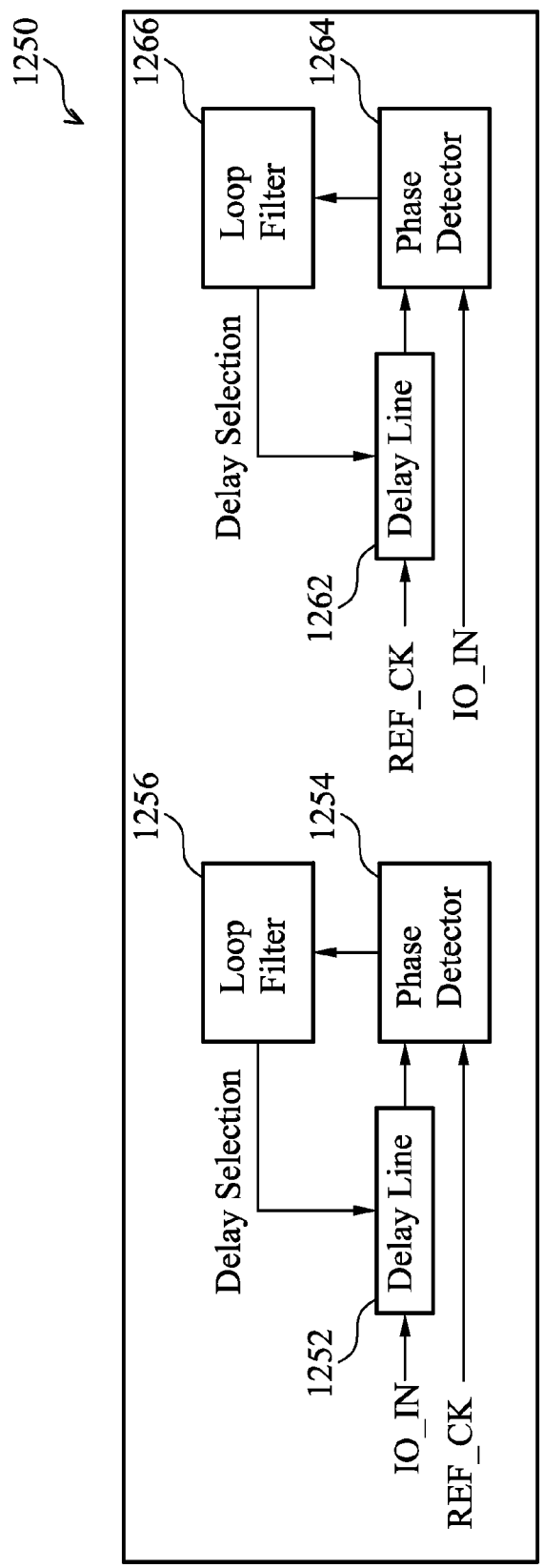

In one embodiment, when data is read from a target NAND flash IC, a voltage on an I/O pin of the target NAND flash IC is sampled according to a over-sampling clock signal with a frequency higher than that of an operating clock signal of the target NAND flash IC, and a transition position is detected from the over-sampled result as a reference for determining a delay period suitable for the target NAND flash IC. Referring to FIGS. 12A, 12B, 12D, 12E, and 12G, block diagrams of five embodiments of over-sampling circuits 1200, 1210, 1220, 1240, and 1250 for over-sampling the IO-pin of a NAND flash IC according to the invention is shown. The over-sampling circuit 1200 shown in FIG. 12A comprises four D-type flip-flops 1202~1208 for sampling input signals thereof according to an over-sample clock signal to obtain the over-sample result. The over-sampling circuit 1210 shown in FIG. 12B comprises four D-type flip-flops 1212~1218 for sampling input signals thereof according to over-sample clock signals REF_PH0_CK~REF_PH3_CK with different phases shown in FIG. 12C to obtain the over-sample result. The over-sampling circuit 1220 shown in FIG. 12D comprises delay cells 1222~1228 and D-type flip-flops 1232~1238, wherein the delay cells 1222-1228 sequentially delay an input signal IO_IN to obtain signals delayed by different periods, and the D-type flip-flops 1232-1238 sample the delayed signals according to an over-sample clock signal ref-clk to obtain the over-sample result. The over-sampling circuit 1240 shown in FIG. 12E comprises an edge detector 1241 and four D-type flip-flops 1242~1248, wherein the edge detector 1241 detects a transition edge from an input signal IO_IN to obtain an edge signal, and the D-type flip-flops respectively sample the edge signal according to over-sample clock signals REF_PH0_CK~REF_PH3_CK with different phases shown in FIG. 12F to obtain the over-sample result. In addition, two methods to obtain the proper access timing of I/O bus are shown in FIG. 12G. The first method of FIG. 12G is the left delay locked loop that comprises a delay line 1252, a phase detector 1254, and a loop filter 1256, and locks an input signal IO_IN delayed by the delay line 1252 according to a phase of a reference clock signal REF_CK. The first method of FIG. 12G is the right delay locked loop that comprises a delay line 1262, a phase detector 1264, and a loop filter 1266, and locks the reference clock signal REF_CK delayed by the delay line 1262 according to a phase of the input signal IO_IN.

Figure 13:
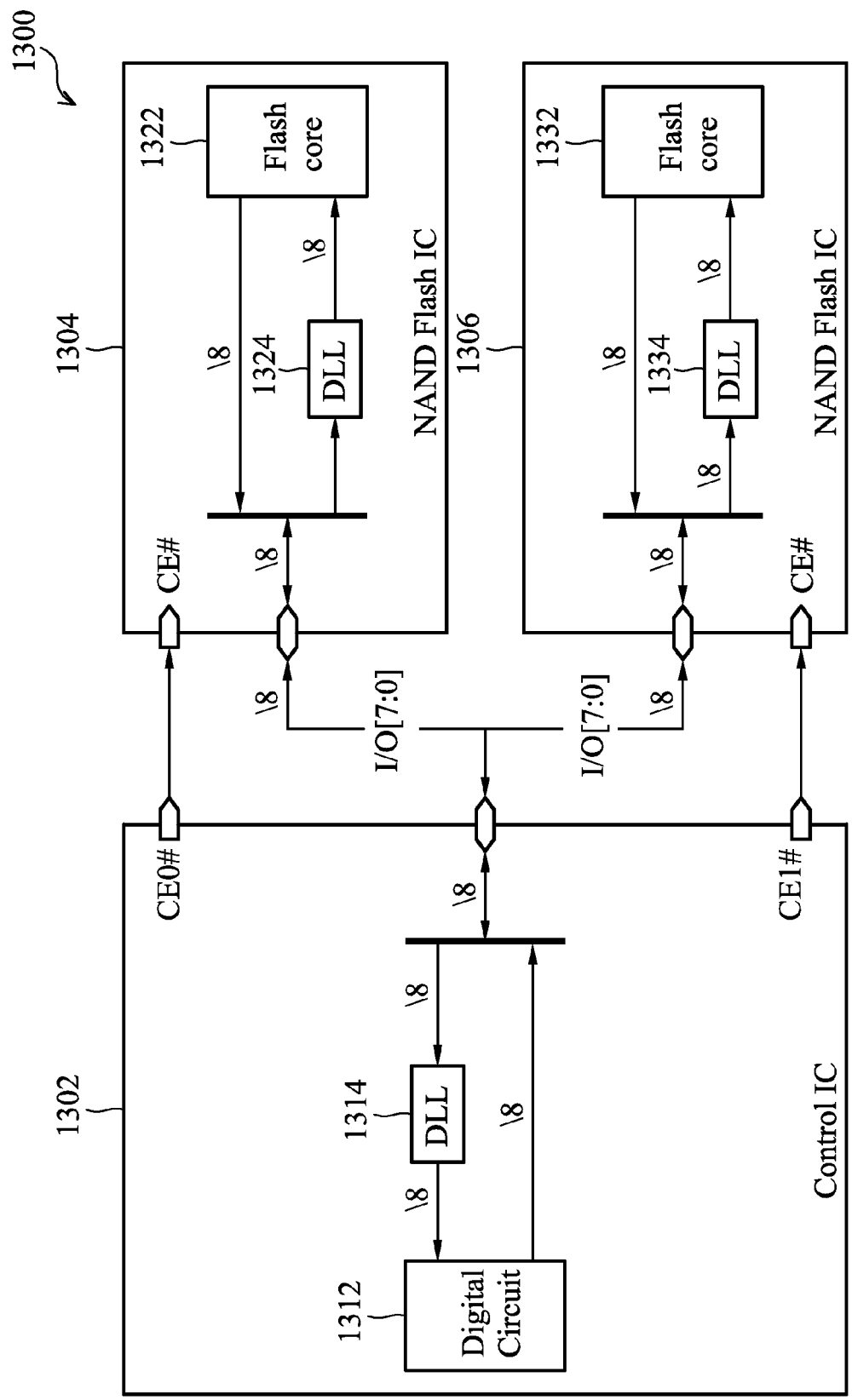
FIG. 13 is a block diagram of another embodiment of a flash device according to the invention.

Referring to FIG. 13, a block diagram of a another embodiment of a flash device 1300 according to the invention is shown. The flash device 1300 comprises a control IC 1302 and two NAND flash ICs 1304 and 1306. The control IC 1302 and the NAND flash ICs 1304 and 1306 all comprise delay locked loop circuits 1314, 1324, and 1334 for automatically adjusting delay periods of input signals thereof. Whenever the control IC 1302 changes the accessed NAND flash IC, the delay locked loop circuit 1314 automatically relocks the delay period for adjusting the input signals again. The control IC 1302 and the NAND flash ICs 1304 and 1306 therefore receive input signals with timings suitable for access timing properties thereof, thus improving the performance thereof While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flash device, comprising:
a control integrated circuit (IC), generating a plurality of first access signals with first timings to access a first NAND flash integrated circuit, and generating a plurality of second access signals with second timings to access a second NAND flash integrated circuit, wherein the first timings are different from the second timings;
the first NAND flash integrated circuit (IC), accessing data stored therein according to the first access signals; and
the second NAND flash integrated circuit (IC), accessing data stored therein according to the second access signals.

2. The flash device as claimed in claim 1, wherein the first access signals and the second access signals have different access cycle periods in length.

3. The flash device as claimed in claim 1, wherein the control IC generates a first write enable signal with a first write timing to direct the first NAND flash IC to write data, and generates a second write enable signal with a second write timing to direct the second NAND flash IC to write data, wherein the first write timing is different from the second write timing.

4. The flash device as claimed in claim 1, wherein the control IC generates a first read enable signal with a first read timing to direct the first NAND flash IC to read data, and generates a second read enable signal with a second read timing to direct the second NAND flash IC to read data, wherein the first read timing is different from the second read timing.

5. The flash device as claimed in claim 1, wherein the control IC outputs data written to the first NAND flash IC according to a first data output timing, and outputs data written to the second NAND flash IC according to a second data output timing, wherein the first data output timing is different from the second data output timing.

6. The flash device as claimed in claim 1, wherein the control IC adjusts input timing of data read from the first NAND flash IC according to a first data input timing, and adjusts input timing of data read from the second NAND flash IC according to a second data input timing, wherein the first data input timing is different from the second data input timing.

7. The flash device as claimed in claim 1, wherein the control IC comprises:
   a digital circuit, generating a first write enable source signal, a second write enable source signal, a first read enable source signal, and a second read enable source signal;
   a first adjustable delay unit, delaying the first write enable source signal for a first write delay period to generate a first write enable signal for directing the first NAND flash IC to write data;
   a second adjustable delay unit, delaying the second write enable source signal for a second write delay period to generate a second write enable signal for directing the second NAND flash IC to write data;
   a third adjustable delay unit, delaying the first read enable source signal for a first read delay period to generate a first read enable signal for directing the first NAND flash IC to read data; and
   a fourth adjustable delay unit, delaying the second read enable source signal for a second read delay period to generate a second read enable signal for directing the second NAND flash IC to read data,
   wherein the first write delay period is different from the second write delay period in length, and the first read delay period is different from the second read delay period in length.

8. The flash device as claimed in claim 1, wherein the control IC comprises:
   a digital circuit, generating a chip selection signal indicating whether the first NAND flash IC or the second NAND flash IC is being accessed, a write enable source signal, and a read enable source signal;
   a first multiplexer, selecting a write delay period from a first write delay period corresponding to the first NAND flash IC and a second write delay period corresponding to the second NAND flash IC according to the chip selection signal;
   a first adjustable delay unit, delaying the write enable source signal for the write delay period to obtain a write enable signal for directing the first NAND flash IC or the second NAND flash IC to write data;
   a second multiplexer, selecting a read delay period from a first read delay period corresponding to the first NAND flash IC and a second read delay period corresponding to the second NAND flash IC according to the chip selection signal; and
   a second adjustable delay unit, delaying the read enable source signal for the read delay period to obtain a read enable signal for directing the first NAND flash IC or the second NAND flash IC to read data,
   wherein the first write delay period is different from the second write delay period in length, and the first read delay period is different from the second read delay period in length.

9. The flash device as claimed in claim 1, wherein the control IC comprises:
   a digital circuit, generating a chip selection signal indicating whether the first NAND flash IC or the second NAND flash IC is being accessed, generating an output data latch signal and an input data latch signal, outputting a plurality of output data source signals, and receiving a plurality of input data source signals;
   a first multiplexer, selecting an output data delay period from a first output data delay period corresponding to the first NAND flash IC and a second output data delay period corresponding to the second NAND flash IC according to the chip selection signal;
   a first adjustable delay unit, delaying the output data latch signal for the output data delay period to obtain an adjusted output data latch signal;
   a first latch circuit, latching the output data source signals according to the adjusted output data latch signal to obtain a plurality of output data signals output to the first NAND flash IC or the second NAND flash IC to be output thereto;
   a second multiplexer, selecting an input data delay period from a first input data delay period corresponding to the first NAND flash IC and a second input data delay period corresponding to the second NAND flash IC according to the chip selection signal;
   a second adjustable delay unit, delaying the input data latch signal for the input data delay period to obtain an adjusted input data latch signal;
   a second latch circuit, latching a plurality of input data signals received from the first NAND flash IC or the second NAND flash IC according to the adjusted input data latch signal to obtain the input data source signals delivered to the digital circuit,
   wherein the first output data delay period is different from the second output data delay period in length, and the first input data delay period is different from the second input data delay period in length.

10. The flash device as claimed in claim 1, wherein the control IC comprises:
   a digital circuit, generating a chip selection signal indicating whether the first NAND flash IC or the second NAND flash IC is being accessed, outputting a plurality of written data source signals, and receiving a plurality of read data source signals;
   a plurality of first multiplexers, selecting a plurality of written data delay periods from a plurality of first written data delay periods corresponding to the first NAND flash IC and a plurality of second written data delay periods corresponding to the second NAND flash IC according to the chip selection signal;
   a plurality of first adjustable delay units, respectively delaying the written data source signals for the written data delay periods to obtain a plurality of written data signals output to the first NAND flash IC or the second NAND flash IC;
   a plurality of second multiplexers, selecting a plurality of read data delay periods from a plurality of first read data delay periods corresponding to the first NAND flash IC and a plurality of second read data delay periods corresponding to the second NAND flash IC according to the chip selection signal; and a plurality of second adjustable delay units, delaying a plurality of read data signals received from the first NAND flash IC or the second NAND flash IC for the read data delay periods to obtain the read data source signals delivered to the digital circuit, wherein the first written data delay periods are different from the second written data delay periods in length, and the first read data delay periods are different from the second read data delay periods in length.

11. A method for improving performance of a flash device, wherein the flash device comprises a control integrated circuit (IC), a first NAND flash integrated circuit (IC), and a second NAND flash integrated circuit (IC), comprising:

directing the control IC to generate a plurality of first access signals with first timings to access the first NAND flash IC;

directing the first NAND flash IC to access data stored therein according to the first access signals;

directing the control IC to generate a plurality of second access signals with second timings to access the second NAND flash IC; and directing the second NAND flash IC to access data stored therein according to the second access signals, wherein the first timings is different from the second timings.

12. The method as claimed in claim 11, wherein the first access signals and the second access signals have different access cycle periods in length.

13. The method as claimed in claim 11, wherein the method further comprises:

directing the control IC to generate a first write enable signal with a first write timing to direct the first NAND flash IC to write data; and directing the control IC to generate a second write enable signal with a second write timing to direct the second NAND flash IC to write data, wherein the first write timing is different from the second write timing.

14. The method as claimed in claim 11, wherein the method further comprises:

directing the control IC to generate a first read enable signal with a first read timing to direct the first NAND flash IC to read data; and directing the control IC to generate a second read enable signal with a second read timing to direct the second NAND flash IC to read data, wherein the first read timing is different from the second read timing.

15. The method as claimed in claim 11, wherein the method further comprises:

directing the control IC to output data written to the first NAND flash IC according to a first data output timing; and directing the control IC to output data written to the second NAND flash IC according to a second data output timing, wherein the first data output timing is different from the second data output timing.

16. The method as claimed in claim 11, wherein the method further comprises:

directing the control IC to adjust input timing of data read from the first NAND flash IC according to a first data input timing; and directing the control IC to adjust input timing of data read from the second NAND flash IC according to a second data input timing, wherein the first data input timing is different from the second data input timing.

17. A flash device, comprising:

a control integrated circuit (IC), generating a plurality of first access signals to access a first NAND flash integrated circuit, and generating a plurality of second access signals to access a second NAND flash integrated circuit;

the first NAND flash integrated circuit (IC), automatically adjusting first timings of the first access signals to obtain a plurality of first adjusted access signals, and access data stored therein according to the first adjusted access signals; and the second NAND flash integrated circuit (IC), automatically adjusting second timings of the second access signals to obtain a plurality of second adjusted access signals, and access data stored therein according to the second adjusted access signals.

18. The flash device as claimed in claim 17, wherein the first access signals comprise a first write enable signal for directing the first NAND flash IC to write data and a first read enable signal for directing the first NAND flash IC to read data, and the second access signals comprise a second write enable signal for directing the second NAND flash IC to write data and a second read enable signal for directing the second NAND flash IC to read data.

19. The flash device as claimed in claim 17, wherein:

the first NAND flash IC comprises:

a first adjustable delay unit, delaying the first write enable signal for a first write delay period to obtain a first adjusted write enable signal; and a second adjustable delay unit, delaying the first read enable signal for a first read delay period to obtain a first adjusted read enable signal; and the second NAND flash IC comprises:

a third adjustable delay unit, delaying the second write enable signal for a second write delay period to obtain a second adjusted write enable signal; and a fourth adjustable delay unit, delaying the second read enable signal for a second read delay period to obtain a second adjusted read enable signal.

20. The flash device as claimed in claim 17, wherein the first access signals comprise a plurality of first output data signals comprising data output to the first NAND flash IC and a plurality of first input data signals comprising data input from the first NAND flash IC, and the second access signals comprise a plurality of second output data signals comprising data output to the second NAND flash IC and a plurality of second input data signals comprising data input from the second NAND flash IC.

21. A flash device, comprising:

a control integrated circuit (IC), generating a plurality of first access signals with a first current level to access a first NAND flash IC, and generating a plurality of second access signals with a second current level to access a second NAND flash IC, wherein the first current level is different from the second current level;

the first NAND flash integrated circuit (IC), accessing data stored therein according to the first access signals; and the second NAND flash integrated circuit (IC), accessing data stored therein according to the second access signals.

22. The flash device as claimed in claim 21, wherein the first access signals comprise a first write enable signal for directing the first NAND flash IC to write data and a first read enable signal for directing the first NAND flash IC to read data, and the second access signals comprise a second write enable signal for directing the second NAND flash IC to write data and a second read enable signal for directing the second NAND flash IC to read data.

23. The flash device as claimed in claim 21, wherein the first access signals comprise a plurality of first output data signals comprising data output to the first NAND flash IC and a plurality of first input data signals comprising data input from the first NAND flash IC, and the second access signals comprise a plurality of second output data signals comprising data output to the second NAND flash IC and a plurality of second input data signals comprising data input from the second NAND flash IC.

* * * * *